United States Patent [19]

Takagi et al.

[11] Patent Number: 5,076,697

[45] Date of Patent: Dec. 31, 1991

[54] APPARATUS AND METHOD FOR INSPECTING DEFECT OF MOUNTED COMPONENT WITH SLIT LIGHT

[75] Inventors: Yuji Takagi; Daisuke Katsuta, both of Yokohama; Seiji Hata, Fujisawa, all of Japan

[73] Assignee: Hitachi, Ltd., Tokyo, Japan

[21] Appl. No.: 257,969

[22] Filed: Oct. 14, 1988

[30] Foreign Application Priority Data

Oct. 14, 1987 [JP] Japan ................... 62-257192
Apr. 19, 1988 [JP] Japan ................... 63-94416
May 23, 1988 [JP] Japan ................... 63-123898

[51] Int. Cl.$^5$ .................... G01B 11/24; G06K 9/00
[52] U.S. Cl. ............................... 356/376; 356/394; 356/237; 382/8
[58] Field of Search ............ 356/376, 237, 387, 394, 356/23; 250/458.1, 206, 202, 560; 351/212, 206; 382/8

[56] References Cited

U.S. PATENT DOCUMENTS

| | | | |
|---|---|---|---|
| 4,343,553 | 8/1982 | Nakagawa et al. | 356/376 |
| 4,492,472 | 1/1985 | Asano et al. | 356/376 |
| 4,582,404 | 4/1986 | Hamilton | 351/212 |
| 4,650,333 | 3/1987 | Crabb et al. | 356/376 |
| 4,731,853 | 3/1988 | Hata et al. | 382/8 |
| 4,772,125 | 9/1988 | Yoshimura et al. | 250/458.1 |
| 4,978,224 | 12/1990 | Kishimoto et al. | 356/394 |

FOREIGN PATENT DOCUMENTS

| | | |
|---|---|---|
| 30659 | 8/1978 | Japan . |
| 135941 | 2/1982 | Japan . |
| 76902 | 9/1984 | Japan . |
| 107105 | 10/1984 | Japan . |
| 0157299 | 3/1985 | Japan . |
| 294302 | 6/1985 | Japan . |
| 272106 | 5/1986 | Japan . |
| 62-21011 | 1/1987 | Japan . |
| 62-265506 | 11/1987 | Japan . |

OTHER PUBLICATIONS

Automated Visual Inspection for Printed Circuit Board, Fujitsu Sci. Tech. J. Mar. 1988, Ando et al.

Primary Examiner—Richard A. Rosenberger
Assistant Examiner—Hoa Pham
Attorney, Agent, or Firm—Antonelli, Terry, Stout & Kraus

[57] ABSTRACT

Light projectors for slit lights are so arranged that at least two slit lines developed by projecting the slit lights on a chip component or the like obliquely thereto intersect each other, and the slit lines are imaged from above the component or the like by TV cameras so as to extend horizontally in the corresponding images. The shapes of the slit lines in the images are analyzed by an image processor, to detect the state change of the chip component or the like, such as the misplacement thereof. Further, if necessary, in order to enhance the contrast of the pattern of the slit line, the slit light is projected by a stroboscopic lamp within the exposure time of the TV camera, for a short time interval which is not longer than the exposure time.

5 Claims, 19 Drawing Sheets

FIG. 1
PRIOR ART
(1a) 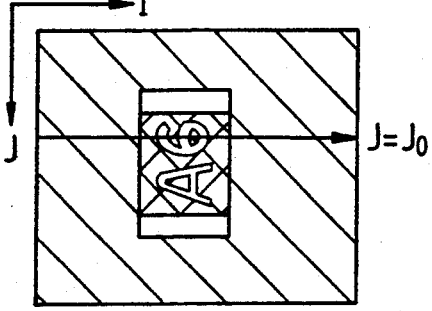
(1b) 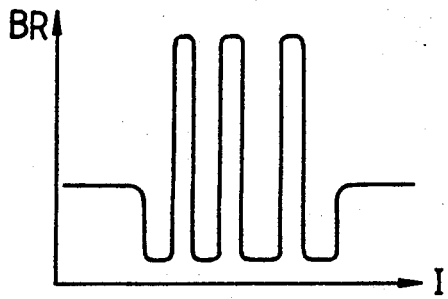
(2a) 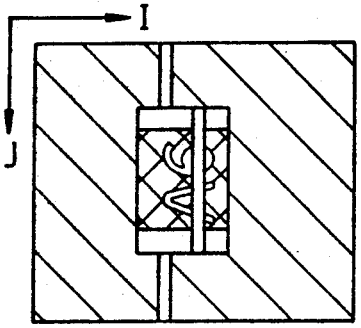
(2b) 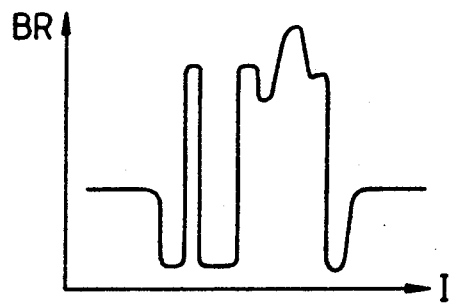
(3a) 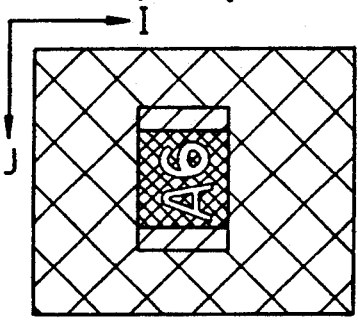
(3b) 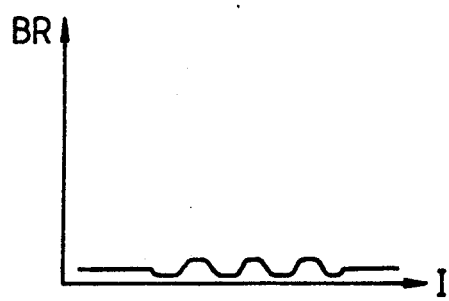
(4a) 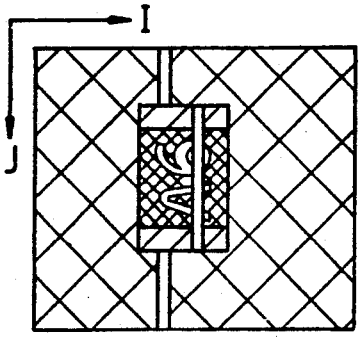
(4b) 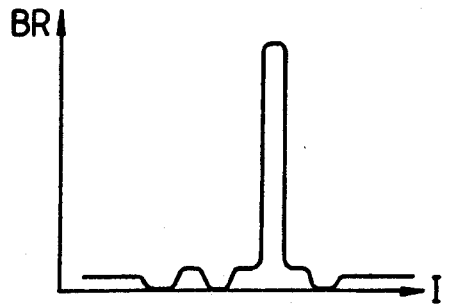

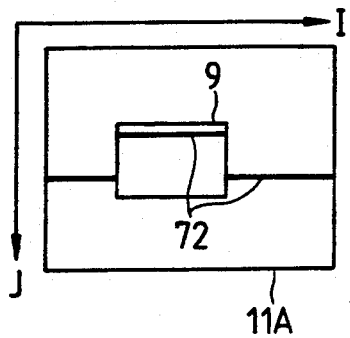 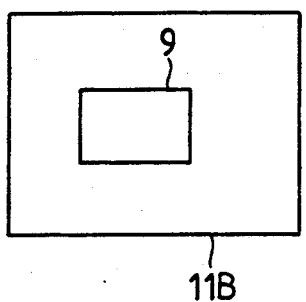 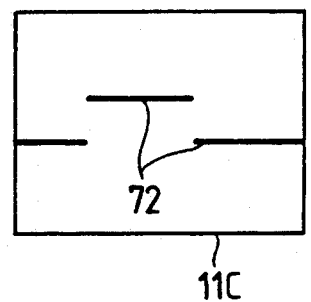
FIG. 12a  FIG. 12b  FIG. 12c
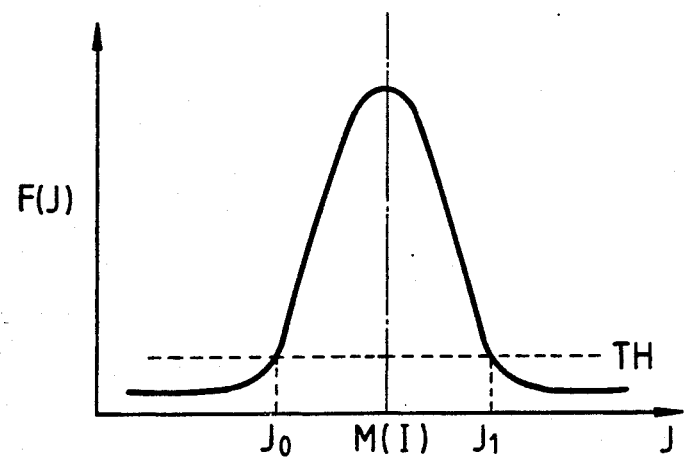
FIG. 13
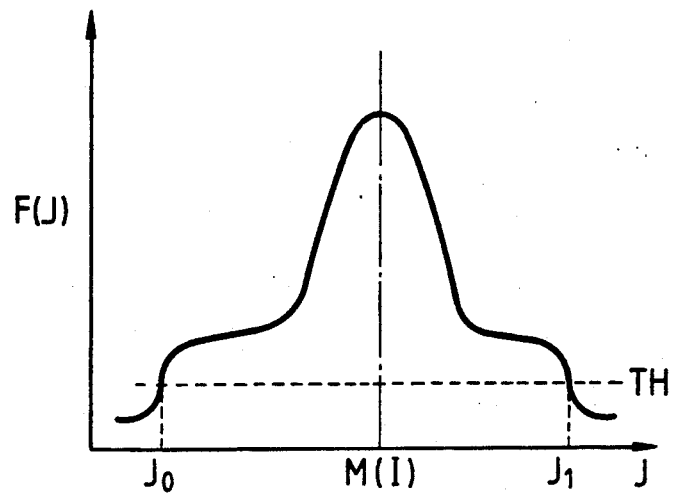
FIG. 14

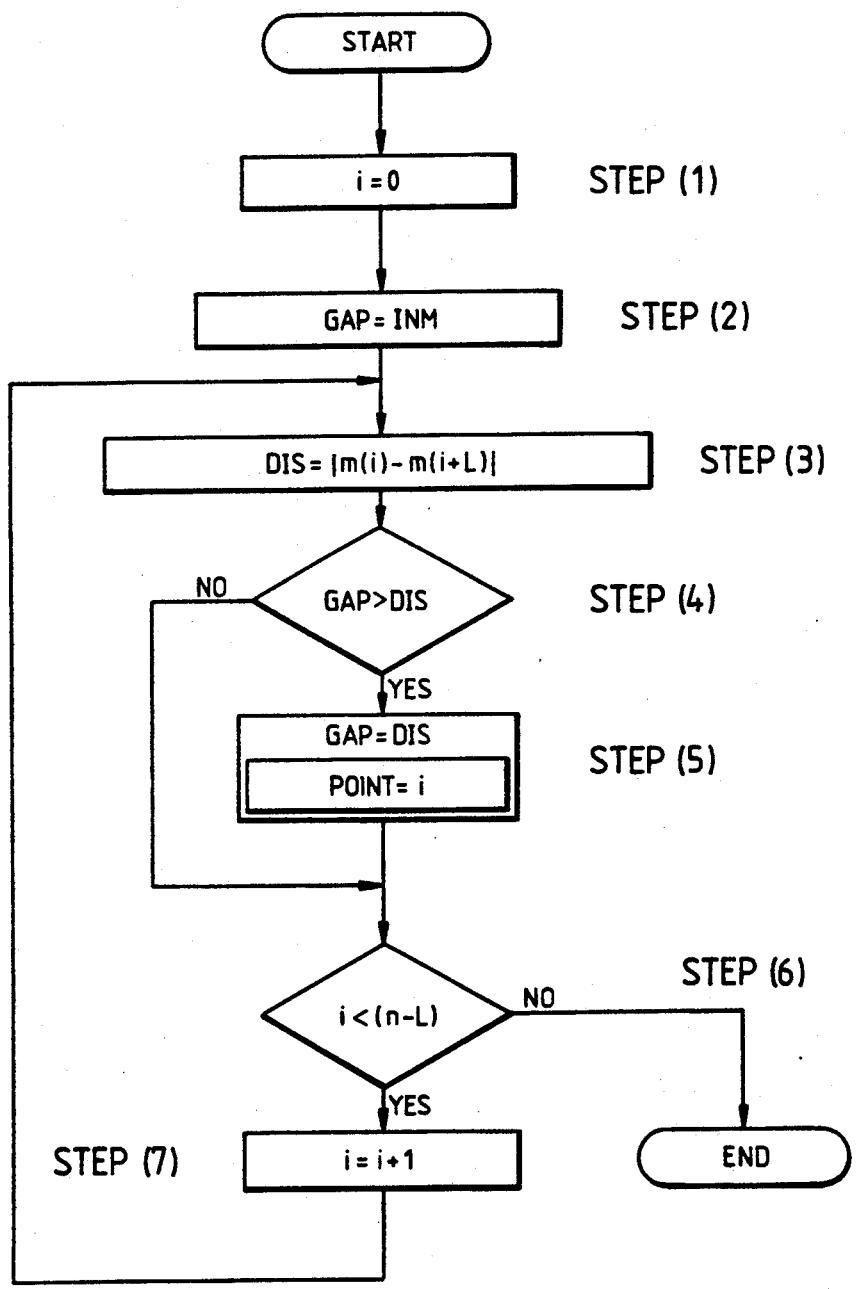

APPARATUS AND METHOD FOR INSPECTING DEFECT OF MOUNTED COMPONENT WITH SLIT LIGHT

BACKGROUND OF THE INVENTION

The present invention relates to an apparatus for detecting, for example, a position of that part of the surface of a printed circuit board on which a shape change exists, a position of a component such as chip component which is mounted on a surface, or any of damage of a component, misplacement of a component, breaking of wire, etc. (hereinbelow, also termed the "defect of components").

As described in, for example, Japanese Patent Application Laid-open No. 294302/1986, a prior-art inspection machine for misplaced chip components mounted on a printed circuit board has adopted a method wherein the component to be inspected is irradiated by utilizing a plurality of illuminations, an image of good contrast and an image with only a specified object emphasized are input, and the resulting input image is binary-coded, thereby to inspect the misplacement of the component.

There has also been adopted a method wherein, as described in Japanese Patent Application Laid-open No. 135941/1983, an object to be inspected is irradiated by a parallel illumination, and the shadow of the component to be inspected is formed on a board and is input as an image, thereby to determine the external shape and position of the chip component.

Regarding the prior-art techniques mentioned above, the method disclosed in Japanese Patent Application Laid-open No. 294302/1986 does not give consideration to a case where the combination between the color of the component to be inspected and the color of the board affords a poor contrast, e. g., a case where the colors of the two are similar, so that objects applicable for the inspection have been limited.

The apparatus disclosed in Japanese Patent Application Laid-open No. 135941/1983 does not give consideration to components in more complicated shapes, such as a cylindrical component and a component in any other different shape, so that objects applicable for the inspection have been limited similarly to the above.

Further, both the prior-art techniques project light positively. Nevertheless, they do not consider blooming, smear etc. on imaging devices, which are ascribable to attendant reflected light of high brightness from a solder surface or the like and which occur particularly when solid-state imaging devices are used This has led to the problem that the inspection after soldering becomes difficult.

In addition, as disclosed in the official gazette of Japanese Patent Application Laid-open No. 30659/1980, a position detection apparatus has been employed in order to detect the mounted positions of electronic components installed on a printed circuit board In the prior-art position detecting apparatus, slit light is projected on the printed circuit board in a direction different from the imaging direction of a TV camera, to form a slit line thereon, an image having the slit line as shown at (2a) in FIG. 1 is taken by the TV camera, the slit line is extracted from the image, and the mounted position of the electronic component is detected on the basis of the shape of the extracted slit line.

In such a position detection apparatus, however, the extraction of the slit line is difficult More specifically, (1a) in FIG. 1 is a diagram showing an image obtained in such a way that the printed circuit board is imaged by the TV camera without projecting the slit light thereon, and (1b) and (2b) in FIG. 1 are graphs showing the brightnesses of the images depicted at (1a) and (2a) in FIG. 1, on I-directional lines at $J=J_0$. As apparent from the graphs, in a case where the slit light has been projected on a part being originally bright, the brightness of the slit line differs little from the brightness of the same place without the projection of the slit light It is therefore difficult to extract the slit line Still further, as disclosed in the official gazettes of Japanese Patent Applications Laid-open Nos. 76903/1986 and 107105/1986, it has recently been practised that, in the state in which slit light is obliquely projected on an electronic component mounted on a printed circuit board, an image is taken from above the printed circuit board by a television camera, whereupon the position of the electronic component is detected from the shape of a slit line generated by the projection of the slit light.

In the prior-art method of detecting the position of the electronic component by the use of the slit light, a threshold value is set beforehand, and in the presence of a slit line which is distant in excess of the threshold value from the slit line on the surface of the printed circuit board, the corresponding point is judged as a point on the end part of the electronic component, thereby to detect the position of the electronic component.

Meanwhile, usually the position of the electronic component is detected before this electronic component is soldered to the printed-wiring board. Since, however, the electronic component is sometimes misplaced at the soldering step, the position of the electronic component needs to be also detected after the soldering thereof on the printed-wiring board.

Herein, when the electronic component 69 has been soldered with solder portions 80 as illustrated in FIG. 2, image data becomes as shown in FIG. 3a, and the slit line 72 is not broken at the parts or edge points thereof corresponding to the end parts of the electronic component 69. When the position of the electronic component 69 has been detected with the threshold value set at TH1, the position of the edge point is judged to be $i_2$ as shown in FIG. 3b although the correct position of the edge point is $i_1$. Therefore, the position of the electronic component 69 cannot be precisely detected. In order to solve this problem, an appropriate threshold value such as TH2 may be set. Since, however, the distance between the slit line 72 on the surface of the printed circuit board and the slit line 72 on the electronic component 69 disperses greatly, depending upon the state of illumination, the kind of the electronic component 69, etc., it is difficult to set the appropriate threshold value.

Moreover, it is sometimes the case that, as illustrated in FIG. 4, the slit line 72 breaks due to the regular reflection of the slit light attributed to the luster of the solder 80, etc. The image data in this case becomes as shown in FIG. 5a. When the position of the electronic component 69 has been detected with the threshold value set at TH1, the position of the edge point is judged to be $i_3$ as depicted in FIG. 5b. Therefore, the position of the electronic component 69 cannot be precisely detected

SUMMARY OF THE INVENTION:

An object of the present invention is to provide an apparatus for detecting the position of a part where the shape change of a component exists, for example, an inspection machine for the precise detection of the misplacement of a chip component, according to which the misplacement of the chip component after the soldering thereof to a printed circuit board can be always inspected stably without being affected by the color and shape of the chip component, the color of the printed circuit board, etc.

The above object is accomplished by an inspection machine for the misplacement of a chip component, in which at least two slit light projectors are so disposed that slit lights projected therefrom intersect each other, the slit lights are reflected by galvano-mirrors and are thereafter thrown obliquely to a circuit board so as to project slit lines on the circuit board and the chip component mounted thereon, the slit lines are imaged from above the circuit board by television cameras so that they may become horizontal in the images of the cameras, and the shapes of the slit lines in the images are analyzed by an image processor, thereby to detect the misplacement of the chip component.

Besides, in order to extract the pattern of a slit line with ease and at a high contrast, the present invention disposes light irradiation control means for projecting slit light during the exposure of an imager, for example, a television camera, for a time interval shorter than the exposure time of the imager (at most, a time interval not exceeding the above exposure time).

Further, the present invention has for its object to provide a position detecting method for an electronic component, according to which the position of the electronic component can be precisely detected even if a slit line is not broken at an edge point. In order to accomplish this object, slit light is projected on an electronic component in a direction oblique thereto, a slit line generated by the projection of the slit light is imaged by a camera, a conforming part to which the value of the dimensional data of the electronic component as stored in advance is applicable is detected from the shape of the slit line, and the position of the electronic component is found on the bas of the conforming part

BRIEF DESCRIPTION OF THE DRAWINGS:

FIG. 1 is a diagram for explaining image processes in a prior art and according to the present invention.

FIG. 27 is a flow chart showing the processing steps of the component position detecting method employing the apparatus depicted in FIGS. 25 and 26, and FIGS. 28a-28d and FIGS. 29a-29e are diagrams for explaining the method of detecting the state change of a component, such as the position of the component, by the use of the apparatus depicted in FIGS. 25 and 26

DESCRIPTION OF THE PREFERRED EMBODIMENTS

In an apparatus according to the present invention for inspecting the shape change of a component, for example, for inspecting the misplacement of a chip component, slit lights are projected obliquely to a circuit board and are imaged from just above the circuit board, whereby the positions of slit lines in an image differ depending upon the heights of irradiated planes, and hence, the height of the object to be inspected is found by analyzing the shapes of the slit lines. Thus, the position of the chip component mounted on the circuit board can be detected from the ruggedness of the surface of the circuit board, and the detection is not affected by the color and shape of the chip and the color of the circuit board In this case, the lateral misplacement and vertical misplacement of the chip to be inspected can be detected by projecting the slit lines on the object to-be-inspected crosswise.

Regarding the above, usually the chip and the circuit board have comparatively similar tints, the discrimination of which is generally difficult. In the apparatus of the present invention, however, the detection stated above becomes possible without the influence of the tints.

In addition, the slit lights projected from slit light projectors can be reflected by galvano-mirrors so as to throw the slit lines on the object to-be-inspected at any desired angle, so that the slit line can be reliably thrown on the upper surface of the chip for various chip heights. Further, the slit lines thrown on the object are imaged so as to extend horizontally in an image, whereby a bright vertical line called "smear" or "blooming" which appears particularly when solid-state imaging devices are used, in a case where slit light, ordinary illumination light or the like falls directly on the surface of a metal such as solder and return reflected light of high brightness, can be distinguished from the slit lines in terms of the directions of bright lines in the image, so that the erroneous detection of the slit lines can be prevented.

Now, an embodiment pertinent to the above explanation will be described.

Figure 6:
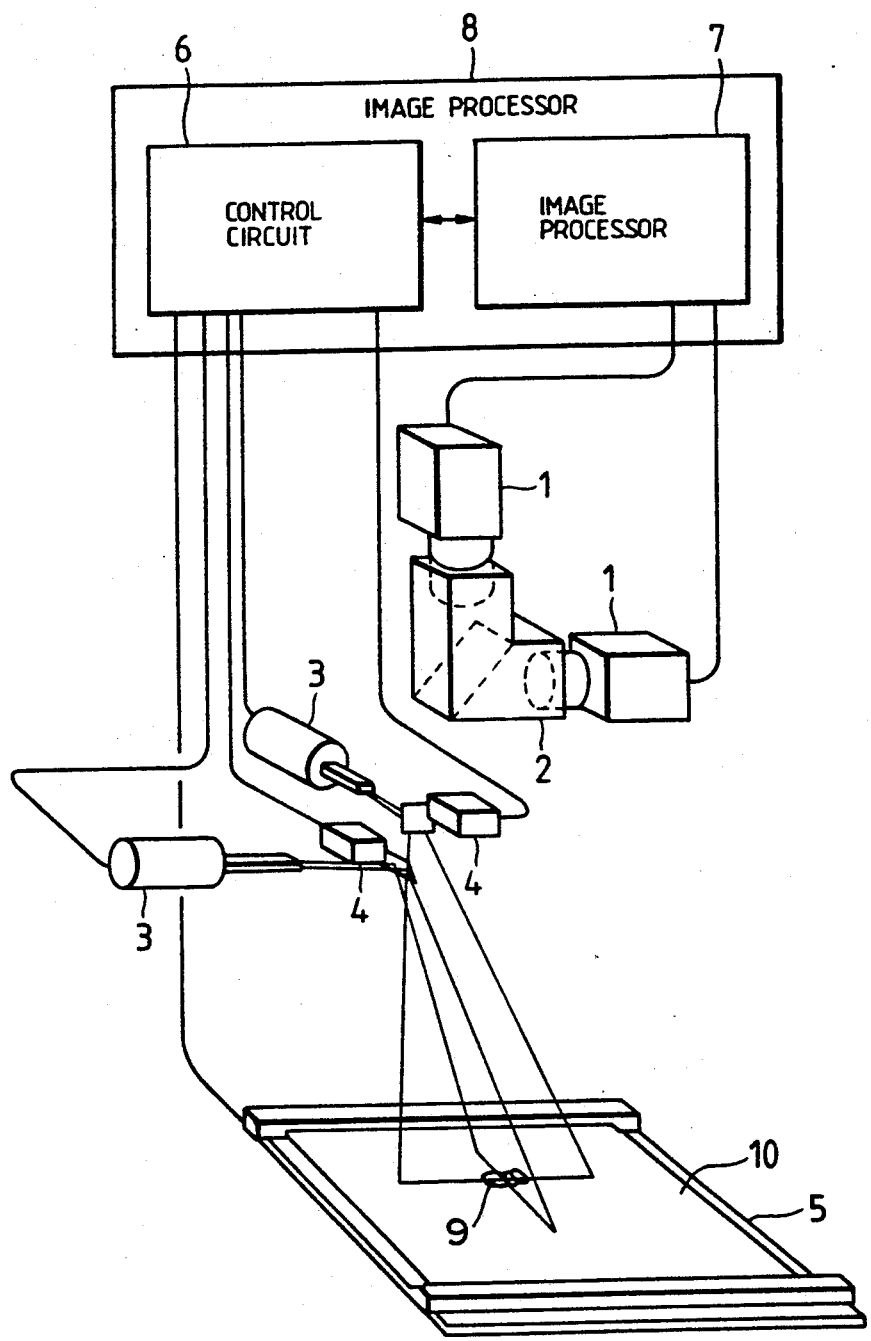
FIG. 6 is a schematic constructional view showing an embodiment of an apparatus for inspecting the misplacement of a component according to the present invention.

FIG. 6 is a schematic constructional view showing one embodiment of an inspection machine for the misplacement of a chip component according to the present invention. Referring to FIG. 6, numeral 1 designates television cameras which image an object to-be-inspected, and numeral 2 a half-mirror which couples the two television cameras 1 optically and permits them to image an identical place in the relation of angles shifting 90° to each other. Numeral 3 indicates slit light projectors, and numeral 4 mirrors, for example, galvano-mirrors which serve to reflect slit lights projected from the slit light projectors 3 and to control th irradiation positions of slit lines on a circuit board. An X-Y stage 5 holds the printed circuit board on which the chip component being the object to-be-inspected is mounted, and it is driven by an X-Y table which is movable on a plane. Numeral 6 indicates a control circuit which performs the lighting controls of the slit light projectors 3 and the operation controls of the galvano-mirrors 4 and X-Y stage (X-Y table) 5, numeral 7 an image processing circuit which processes image data applied from the television cameras 1, numeral 8 an image processor which consists of the control circuit 6 and the image processing circuit 7, numeral 9 the chip component, and numeral 10 the circuit board.

In an inspection machine for electronic components mounted on a circuit board, having a television camera 1, a slit light projector 3, an X-Y stage (X-Y table) 5 on which the printed circuit board with the chip component being an object to-be-inspected mounted thereon is set, and an image processor 8 which processes image data applied from the television camera 1 and controls a system; the apparatus in FIG. 6 consists of an inspection machine for the misplacement of a chip component, comprising two slit light projectors 3 by which slit lines thrown on a circuit board 10 are caused to intersect orthogonally to each other, galvano-mirrors (mirrors) 4 which are controlled by an image processor 8 in order to reflect projected slit lights and to control the irradiation positions of the respective slit lights, and two television cameras 1 and a half-mirror 2 which are so disposed that the two slit lines thrown on the circuit board can be imaged as horizontal lines by television cameras 1, whereby the shapes of the slit lines in the images obtained with the television cameras 1 are analyzed by the image processor 8 so as to detect the misplacement of the chip component.

Figure 7:
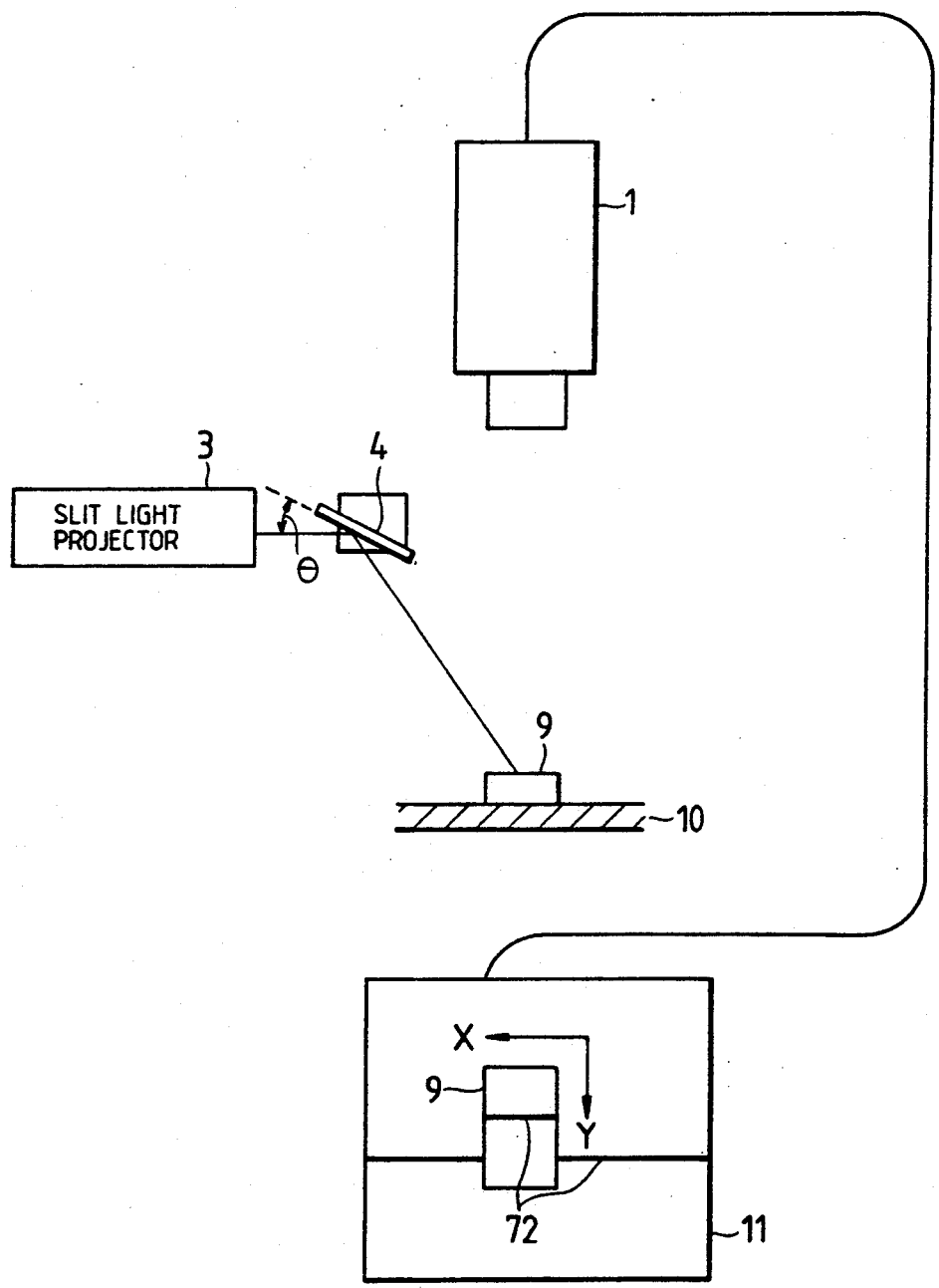
FIG. 7 is a diagram for explaining the portion of a detecting optical system in the apparatus shown in FIG. 6.

FIG. 7 is a diagram for explaining a part of a detecting optical system in FIG. 6. As the optical system in FIG. 6, one television camera 1, slit light projector 3 and galvano-mirror 4 constitute one set, and two such sets are prepared. FIG. 7 shows the side view of one of the two sets. The same symbols indicate identical or equivalent portions throughout the drawings, and in FIG. 7, numeral 9 denotes the chip component which is the object to be inspected, and numeral 10 the printed circuit board on which the chip component 9 is mounted and which is set on the X-Y stage 5 (in FIG. 1). Numeral 11 denotes an input image in the case where an image obtained by throwing the slit line on the chip component to-be-inspected 9 through the galvano-mirror 4 by the slit light projector 3 is imaged and input by the television camera 1. The slit line is shown at numeral 72.

The television camera 1 in FIG. 7 is installed vertically to the circuit board 10, and the slit light from the slit light projector 3 is reflected by the galvano-mirror 4 so as to irradiate the circuit board 10 obliquely. Thus, the part of the slit line thrown on the chip component 9 higher in level than the plane of the circuit board 10 moves upwards as viewed on the image 11, relative to the part of the slit line thrown on the circuit board plane. Since, in this manner, the position of the slit line on the image 11 changes depending upon the ruggedness of the chip component to-be-inspected 9, the position of the chip component to-be-inspected 9 can be detected from the shape of the slit line on the image 11, and the misplacement of the chip component 9 in an X-direction can be detected in FIG. 7. Here, the chip component to-be-inspected 9 differs in height in accordance with the kind thereof Therefore, the slit light from the slit light projector 3 is reflected to control the irradiation position thereof by the galvano-mirror 4 in accordance with the chip component to-be-inspected 9 so that the slit line may be thrown on the upper surface of the chip component. The method of controlling the galvano-mirror 4 by means of the control circuit 6 (in FIG. 6) is carried out in such a way that the angle $\theta$ of the galvano-mirror 4 is controlled by utilizing data indicative of the height of the chip component 9 so that the slit line falls on the upper surface of the chip component 9. In order to detect the misplacement of the chip component 9 in a Y-direction in the image 11 shown in FIG. 7, one set of the optical system illustrated in FIG. 7 is separately prepared For this purpose, the two television cameras 1, slit light projectors 3 and galvano-mirrors 4 shown in FIG. 6 are disposed, and the slit light projectors 3 and galvano-mirrors 4 are respectively arranged so as to orthogonally intersect as depicted in FIG. 6.

Figure 8:
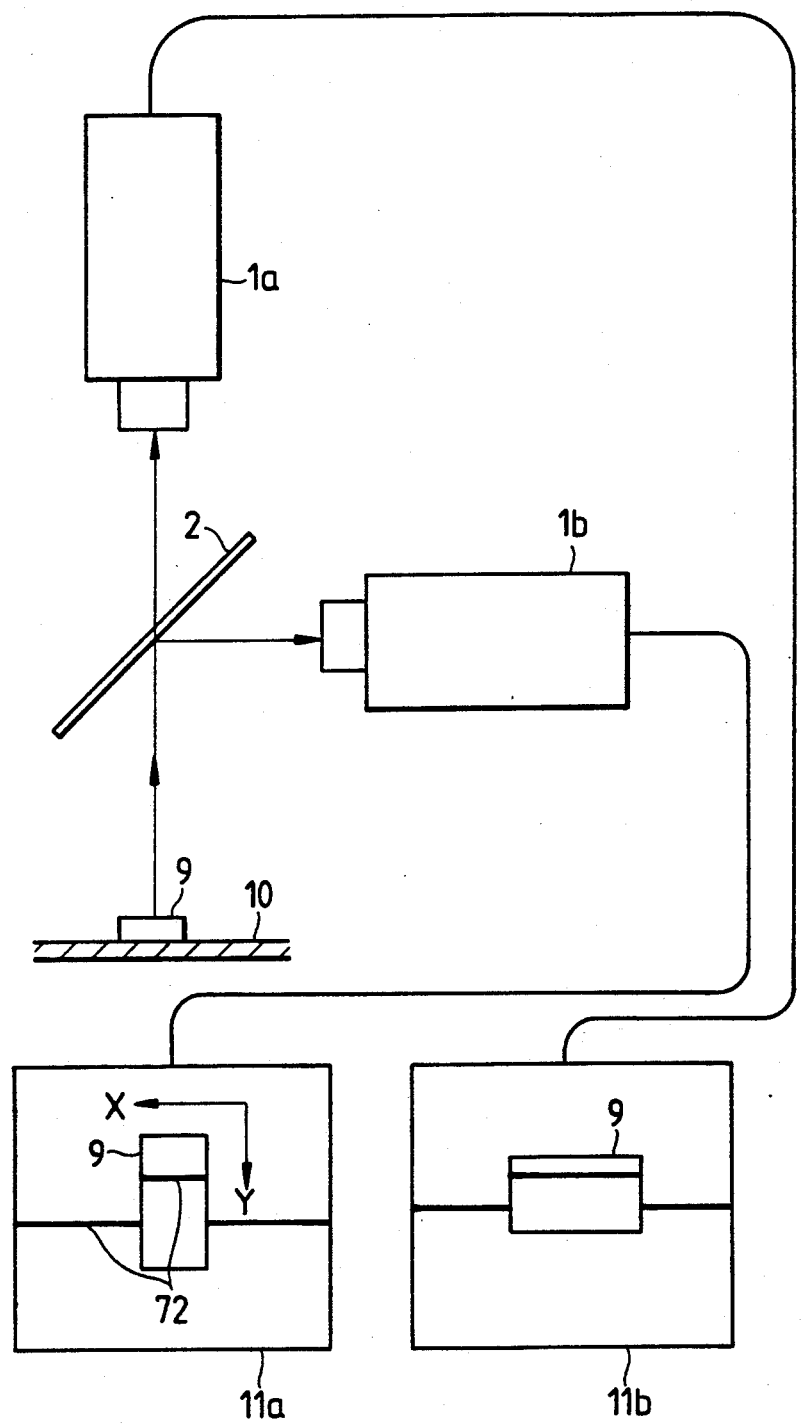
FIG. 8 is a diagram for explaining an imaging system in the apparatus shown in FIG. 6, FIGS. 9 and 10 are diagrams each showing an example of an input image in FIGS. 7 and 8.

FIG. 8 is a diagram for explaining an imaging system in FIG. 6. Regarding the television cameras 1 in FIG. 6, as illustrated in FIG. 8, a light beam which enters from the chip component to-be-inspected 9 on the circuit board 10 is split in two by the semitransparent mirror 2, and the images thereof are taken by two television cameras 1a and 1b. On this occasion, the two television cameras 1a and 1b catch the same object in their images, but these images which are respectively applied by the two television cameras 1a and 1b intersect orthogonally to each other as depicted by input images 11a and 11b so that each slit line is imaged as a horizontal line. Thus, the X- and Y-directional misplacements of the chip component to-be-inspected 9 can be detected from the shapes of the slit lines on the images such as the images 11a and 11b shown in FIG. 8.

Figure 9:
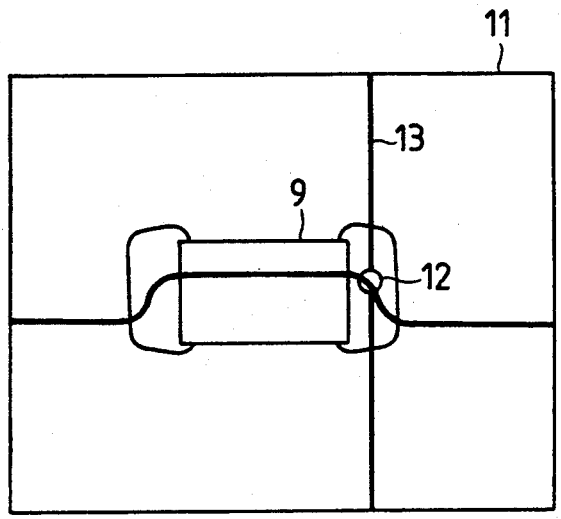
Figure 10:
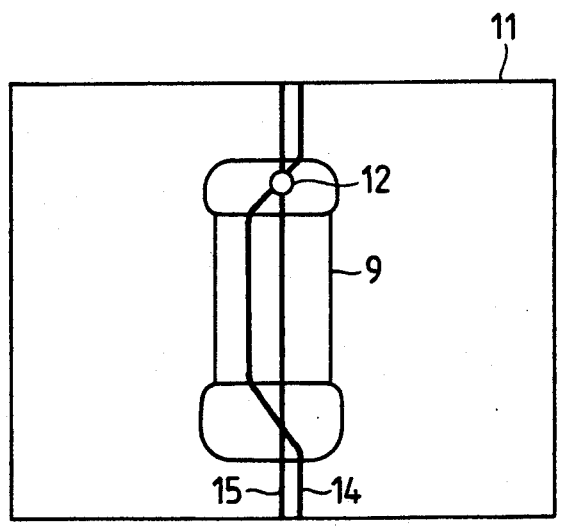

FIGS. 9 and 10 are diagrams for explaining examples of the input images indicated at numeral 11 in FIG. 7 and symbols 11a and 11b in FIG. 8. In FIGS. 9 and 10, numeral 12 designates a point of high brightness, numeral 13 a vertical line of high brightness, numeral 14 a high-brightness vertical line based on the slit line, and numeral 15 a high-brightness vertical line ascribable to reflected light. The slit lines in FIGS. 7 and 8 are imaged by setting the television cameras 1 so as to extend in the horizontal direction within the images as illustrated in the input image 11 in FIG. 7 and the images 11a and 11b in FIG. 8. In this situation, in a case where the slit line thrown on the circuit board 10 to which the chip component to-be-inspected 9 is soldered has been reflected from a solder or metal luster surface on the circuit board 10 as depicted by the image 11 in FIG. 9, the reflected light is imaged as the high-brightness point 12 in the image 11 of the television camera 1, so that the high-brightness vertical line 13 is generated. This vertical line 13, however, can be readily discriminated from the slit line as to the direction. In contrast, if the slit line is imaged so as to extend in the vertical direction within the image as depicted by the image 11 in FIG. 10, unfavorably the discrimination between the high-brightness vertical line 14 based on the slit line and the high-brightness vertical line 15 ascribable to the high-brightness point 12 generated by the reflected light becomes difficult. Next, there will be described a circuit arrangement and an extracting system for stably extracting the slit line from the image in the case where the slit line has been imaged by the television camera 1 so as to extend horizontally in the image.

Figure 11:
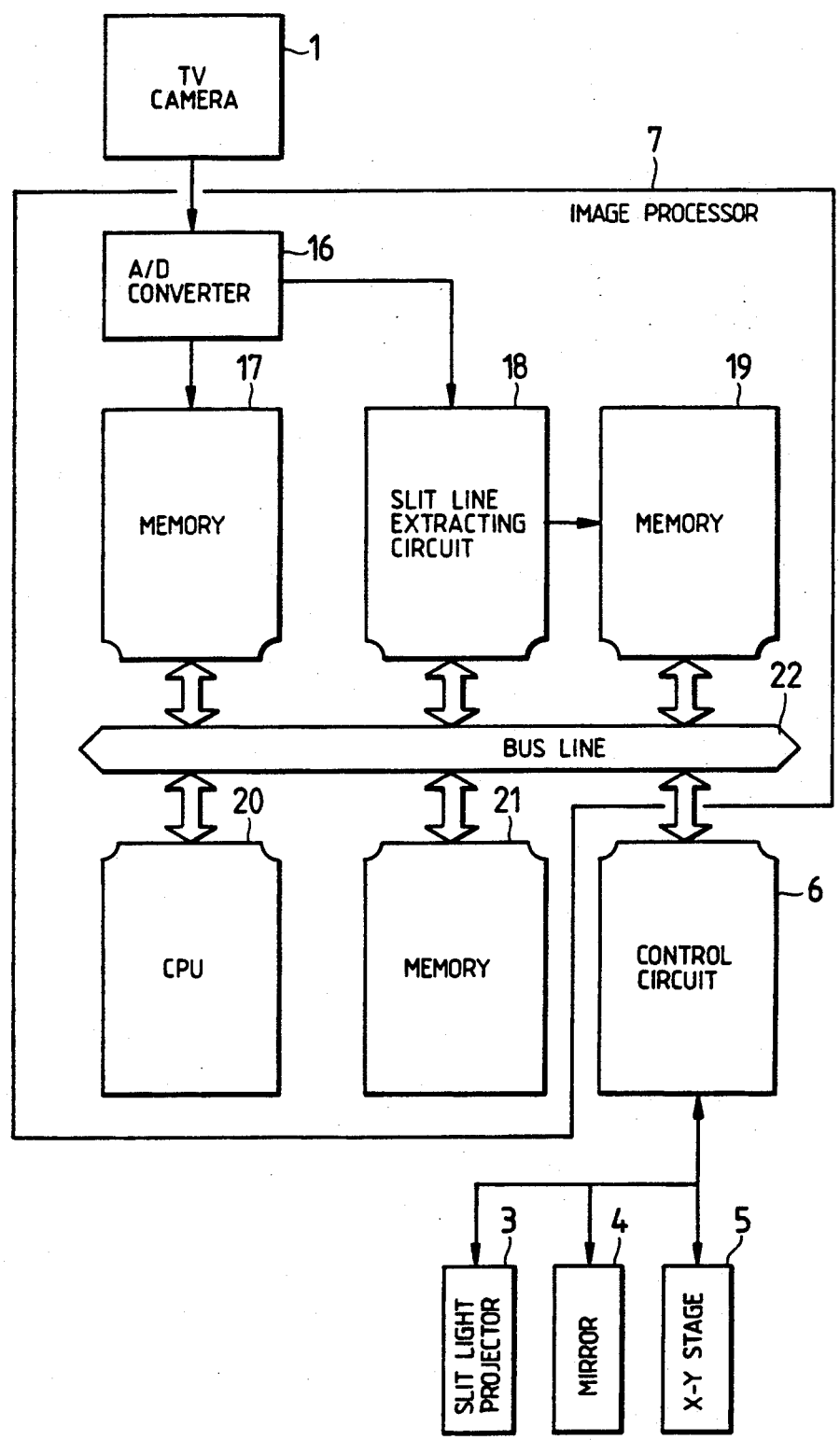
FIG. 11 is a schematic block diagram of an image processing circuit in the apparatus shown in FIG. 6, all of FIGS. 12a-12c, FIG. 13 and FIG. 14 are diagrams for explaining a method of extracting slit lines in the circuit shown in FIG. 11.

FIG. 11 is a schematic arrangement diagram of the image processing circuit 7 shown in FIG. 6 including a slit line extracting circuit 18. Referring to FIG. 11, numeral 16 indicates an A/D (analog-to-digital) converter, numeral 17 an image memory, numeral 18 the slit line extracting circuit, numeral 19 a position memory, numeral 20 a CPU, numeral 21 a memory, and numeral 22 a bus. An image signal applied from the television camera 1 in FIG. 11 is subjected to analog-to-digital conversion by the A/D converter 16 of the image processing circuit 7, and the resulting digital signal can be input to the image memory 17 or the slit line extracting circuit 18. Upon receiving the image data from the A/D converter 16, the slit line extracting circuit 18 executes a slit line extracting calculation and delivers the calculated result to the position memory 19. Under a control by the CPU 20, the control circuit 6 controls the slit light projector 3, galvano-mirror 4 and X-Y stage (X-Y table) 5.

FIGS. 12a, 12b and 12c are diagrams for explaining a slit line extracting method in FIG. 11. Referring to FIGS. 12a–12c, symbol 11A denotes an image obtained by throwing the slit line, symbol 11B an image obtained without throwing the slit line, and symbol 11C a subtracted or difference image. On the basis of the image data from the A/D converter 16, the slit line extracting circuit 18 in FIG. 11 executes the subtraction between the two images; the image 11A obtained by throwing the slit line as shown in FIG. 12a and the image 11B without throwing the slit line as shown in FIG. 12b. Since a part which differs between the two images 11A and 11B is only the irradiation part of the slit line, only the slit line is separated from its background and extracted as the difference image 11C in the above way, whereby the influence of reflected light from a wiring pattern etc. can be eliminated. Coordinates I and J in FIG. 12a correspond to the horizontal and vertical directions of the image, respectively.

FIG. 13 is a diagram for explaining the brightness distribution of the difference image 11C in FIG. 12c. When the distribution of brightnesses in the direction perpendicular to scanning lines is investigated for the difference image 11C in FIG. 12c, the values F(J) of the brightnesses are canceled to exhibit only very slight brightness levels ascribable to the influence of noise components, except the irradiation part of the slit line based on the slit light, as illustrated in FIG. 13. Therefore, only the part of the slit line based on the slit light can be left by setting a fixed threshold value TH. The brightness variation of the slit line part based on the slit light presents the normal distribution as shown in FIG. 13, and the position of the slit line based on the slit light, on the image 11C (in FIG. 12c) is considered to be the center of the brightness distribution, so that a median M(I) at the coordinate I is calculated by a load averaging process according to the following formula, where the coordinates I and J correspond to the horizontal and vertical directions of the image as indicated in FIG. 12a, respectively:

$$M(I) = \frac{\sum_{J=J_0}^{J_1} F(J) * J}{\sum_{J=J_0}^{J_1} F(J)} \quad (1)$$

Here, F(J) represents the value of the bightness at the coordinate J, and $J_0$ and $J_1$ represent the coordinate values of the coordinate J at which the value F(J) of the brightness shown in FIG. 13 exceeds the threshold value TH. The calculation according to this formula (1) is performed for the various values of the coordinate I, whereby the slit line is extracted as a point sequence (I, M(I)) indicated by the following formula (2):

$$(I, M(I)) \text{ where } I = 0, 1, \cdot, N \quad (2)$$

Besides, N denotes the number of the horizontal pixels of the image 11C.

FIG. 14 is a diagram for explaining the brightness distribution of the difference image 11C in FIG. 12c in the presence of the high-brightness vertical line 13 (shown in FIG. 9) attributed to the reflected light. In the foregoing case of FIG. 9 where, in the imaging operation performed by throwing the slit line, the high-brightness point 12 ascribable to the reflected light of high brightness is imaged to develop the high-brightness vertical line 13 on the image 11, the level of the brightness value F(J) of the difference image 11C (shown in FIG. 12c) on the vertical line 13 (shown in FIG. 9) exceeds the threshold value TH over the whole region of the coordinate J as illustrated in FIG. 14, and hence, the part which is subjected to the calculation according to the formula (1) extends over a wide range. Therefore, when the value of a range W expressed by the following has exceeded a certain fixed threshold value WTH:

$$W = J_1 - J_0 \quad (3)$$

the calculated result of the formula (1) is cleared in correspondence with the vertical line 13. By the clearing, the high-brightness vertical line 13 ascribable to the high-brightness reflected light can be prevented from affecting the operation of extracting the slit line There will now be described the circuit arrangement and operation of the slit line extracting circuit 18 shown in FIG. 11, which performs the slit line extracting process based on the above algorithm.

Figure 15:
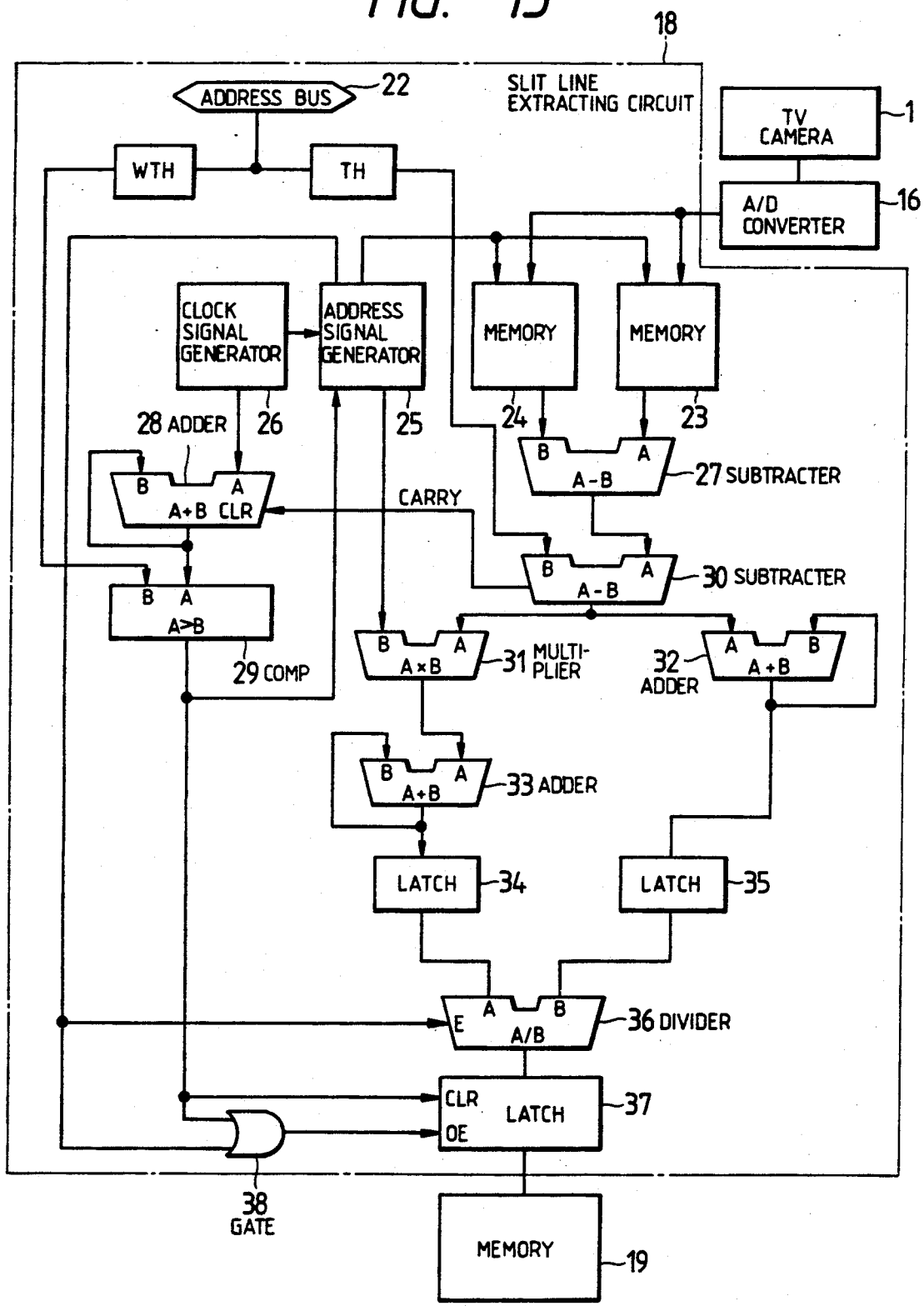
FIG. 15 is a block diagram of a slit line extracting circuit shown in FIG. 11.

FIG. 15 is a circuit block diagram of the slit line extracting circuit 18 in FIG. 11. Referring to FIG. 15, numerals 23 and 24 designate image memories, numeral 25 an address signal generator, numeral 26 a clock signal generator, numeral 27 a subtracter, numeral 28 an adder, numeral 29 a comparator, numeral 30 a subracter, numeral 31 a multiplier, numerals 32 and 33 adders, numerals 34 and 35 latches, numeral 36 a divider, numeral 37 a latch, and numeral 38 a gate.

The image signal applied by the television camera 1 in FIG. 15 is digitized by the A/D converter 16, and the digital signal is stored in the image memories 23 and 24. In this case, the image 11A obtained by throwing the slit line (in FIG. 12a) and the image 11B obtained without throwing the slit line (in FIG. 12b) are respectively stored in the image memory 23 and the image memory 24 in succession. In accordance with the clock signal generator 26, an address signal is sent from the address signal generator 25 to the image memories 23 and 24 so that these image memories may be accessed in the direction perpendicular to the scanning lines. The subtracter 27 is used for generating the data of the difference image 11C from the difference between the data of the image 11A of the image memory 23 as obtained by throwing the slit line and the data of the image 11B of the image memory 24 as obtained without throwing the slit line. Further, the subtracter 30 is used for comparing the brightness value F(J) of the data of the difference image 11C and the threshold value TH as shown in FIGS. 13 and 14. Only the data which is not less than the threshold value TH is applied to the succeeding multiplier 31 and adder 32 so as to be processed therein. More specifically, the multiplier 31 calculates the product between the coordinate value J of the address signal generated by the address signal generator 25 and the data F(J) of the difference image 11C passed through the subtracter 30 from the subtracter 27, and such products F(J)*J are cumulated by the adder 33 so as to find the numerator of the formula (1). On the other hand, the adder 32 cumulates the data items F(J) of the difference image 11C passed through the subtracter 30 from the subtracter 27 and finds the denominator of the formula (1). The calculated results are respectively held in the latches 34 and 35. The result M(I) divided by the divider 36 is delivered to the latch 37 in accordance with an end instruction which is generated by the address signal generator 25 after one vertical scanning line, and the data of the median M(I) in the latch 37 as conforms to the formula (1) is delivered to and stored in the position memory 19. The adder 28 cumulatively adds clock signals delivered from the clock signal generator 26, as long as no carry is developed from the subtracter 30, that is, as long as the calculations are being executed in the arithmetic units 31, 32 and 33. The cumulated result is normally compared with the threshold value WTH of the formula (3) by the comparator 29. When the cumulated result becomes greater than the threshold value WTH, the latch 37 for holding the calculated result M(I) is cleared to supply the position memory 19 with zero data, while at the same time, the address signal generator 25 is reset and is updated for generating the address signal of the next vertical line. Owing to this operation of the comparator 29, it is possible to clear the image data M(I) of the part illustrated in FIG. 14 and including the high-brightness vertical line 13 on the image 11 (in FIG. 9) attributed to the reflected light.

According to the embodiment thus far described, the misplacement of a small-sized flat-packaged chip component which is mounted on a printed circuit board can be detected without being limited by the color and shape of the chip component and the color of the printed circuit board, and the influence of a vertical bright line on imaging devices, which is incurred by reflected light of high brightness from the surface of a metal such as solder, or the like on the circuit board and ascribable to the projection of slit light, can be eliminated.

The embodiment of the present invention brings forth the effects that the misplacement of a chip component can be detected without being limited by the color and shape of the chip component and the color of a printed circuit board, and that the influence of reflected light from solder or the like can be eliminated, so the external appearance of the mounted chip component after a soldering operation can be inspected at a high reliability.

Next, there will be described another embodiment of the present invention, particularly an embodiment which permits an imager, for example, a television camera to take an image at a high contrast In this example, when the exposure time of the camera is shortened, the part of the image taken by the camera, except a slit line can be darkened, and when the quantity of slit light is enlarged, the slit line of the image taken by the camera can be brightened.

Figure 16:
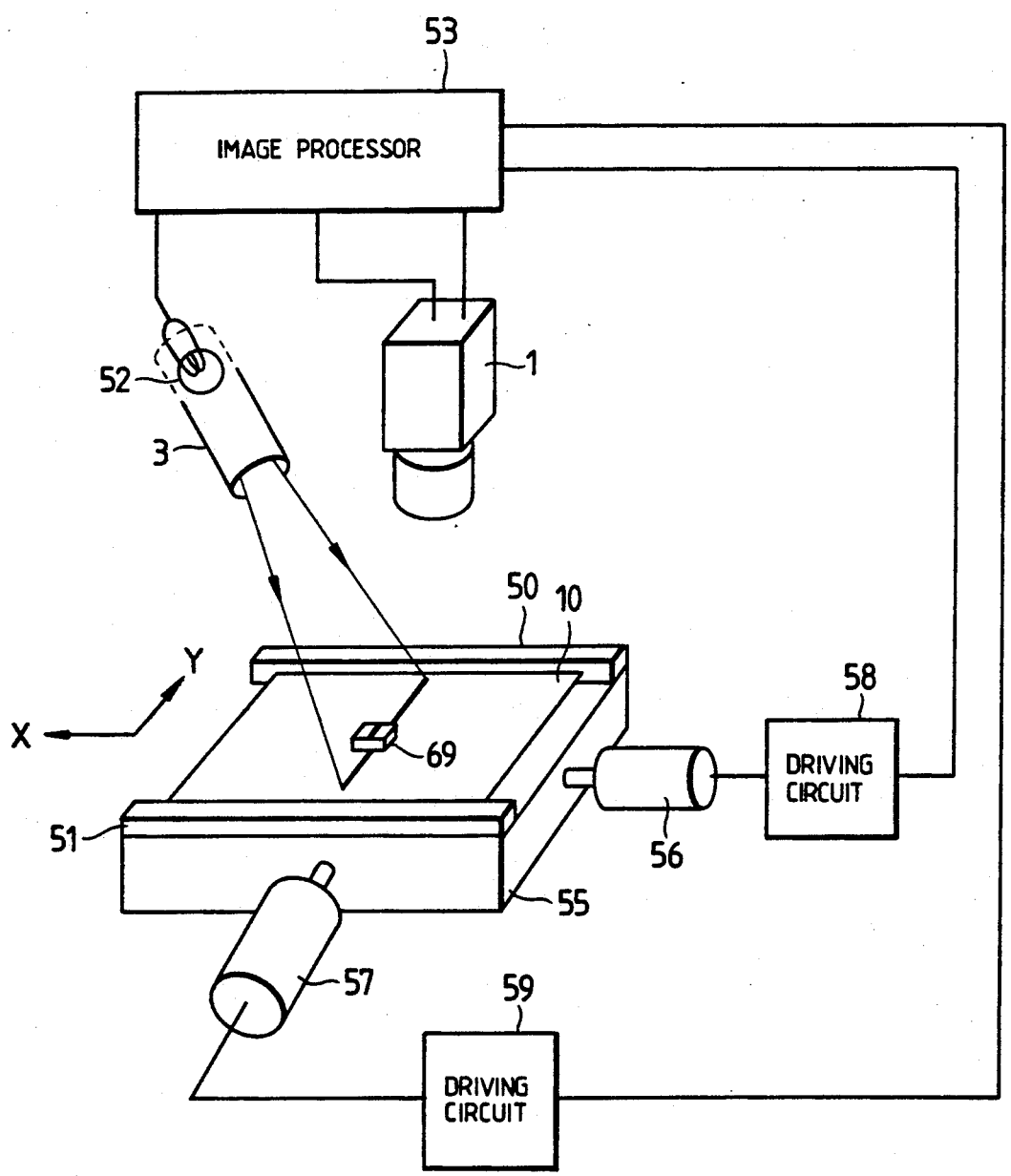
FIGS. 16 and 17 are diagrams each showing a position detecting apparatus for explaining another embodiment of the present invention.

FIG. 16 is a diagram showing a position detection apparatus according to the present invention. Referring to the figure, numeral 55 designates a table, numerals 50 and 51 guide rails which are laid on the table 55, numeral 10 a printed circuit board which is attached to the guide rails 50 and 51, numeral 69 an electronic component which is mounted on the printed circuit board 10, numerals 56 and 57 table drivers which move the table 55 in an X-direction and a Y-direction, respectively, numerals 58 and 59 driving circuits which control the respective table drivers 56 and 57, numeral 1 a TV camera, numeral 52 a stroboscopic lamp, and numeral 3 a slit light projector by which light emitted from the stroboscopic lamp 52 is turned into slit light. Numeral 53 indicates an image processor which controls the driving circuits 58, 59, TV camera 1 and stroboscopic lamp 52 and which extracts a slit line from an image having the slit line and taken by the TV camera 1, so as to detect the position of the electronic component 69 in accordance with the shape of the slit line. The image processor 53 includes light irradiation control means for instructing the stroboscopic lamp 52 to emit the light for a time interval shorter than or equal to the exposure time of the TV camera 1 while the TV camera 1 is exposed to light In the position detection apparatus, the printed circuit board 10 is attached to the guide rails 50 and 51, and the table 55 is moved by the table drivers 56 and 57, thereby to bring the electronic component 69 into the imaging region of the TV camera 1. First, under the conditions that the exposure time of the TV camera 1 is set to be short (for example, at 1/60 sec or less) and that the stroboscopic lamp 52 is not caused to emit the light, the front surface of the printed circuit board 10 is imaged by the TV camera 1, and the image ((3a) in FIG. 1) is stored in the image processor 53. Subsequently, under the conditions that the exposure time of the TV camera 1 is set to be equal to the above and that, during the exposure of the TV camera 1, the stroboscopic lamp 52 is caused to emit the light for the time interval shorter than the exposure time of the TV camera 1, the front surface of the printed circuit board 10 is imaged by the TV camera 1, and the image ((4a) in FIG. 1) is stored in the image processor 53. In the image processor 53, the image shown at (3a) in FIG. 1 is subtracted from the image shown at (4a) in FIG. 1, thereby to extract the slit line, and the mounted position of the electronic component 69 is detected according to the shape of the slit line.

Although, in the above embodiment, the slit line has been extracted by the image subtraction, it may well be extracted by binary-coding the image shown at (4a) in FIG. 1.

In this manner, in the position detection apparatus, the slit line can be readily extracted for the reason that, when the exposure time of the TV camera 1 is shortened, the part of the image taken by the TV camera 1, except the slit line darkens, or that, when the quantity of light of the stroboscopic lamp 52 is enlarged, the slit line of the image taken by the TV camera 1 brightens. This is also apparent from graphs (at (3b) and (4b) in FIG. 1) which show the brightnesses of the images depicted at (3a) and (4a) in FIG. 1, on I-directional lines at $J=J_0$ (the position indicated at (1a) in FIG. 1), respectively.

Figure 17:
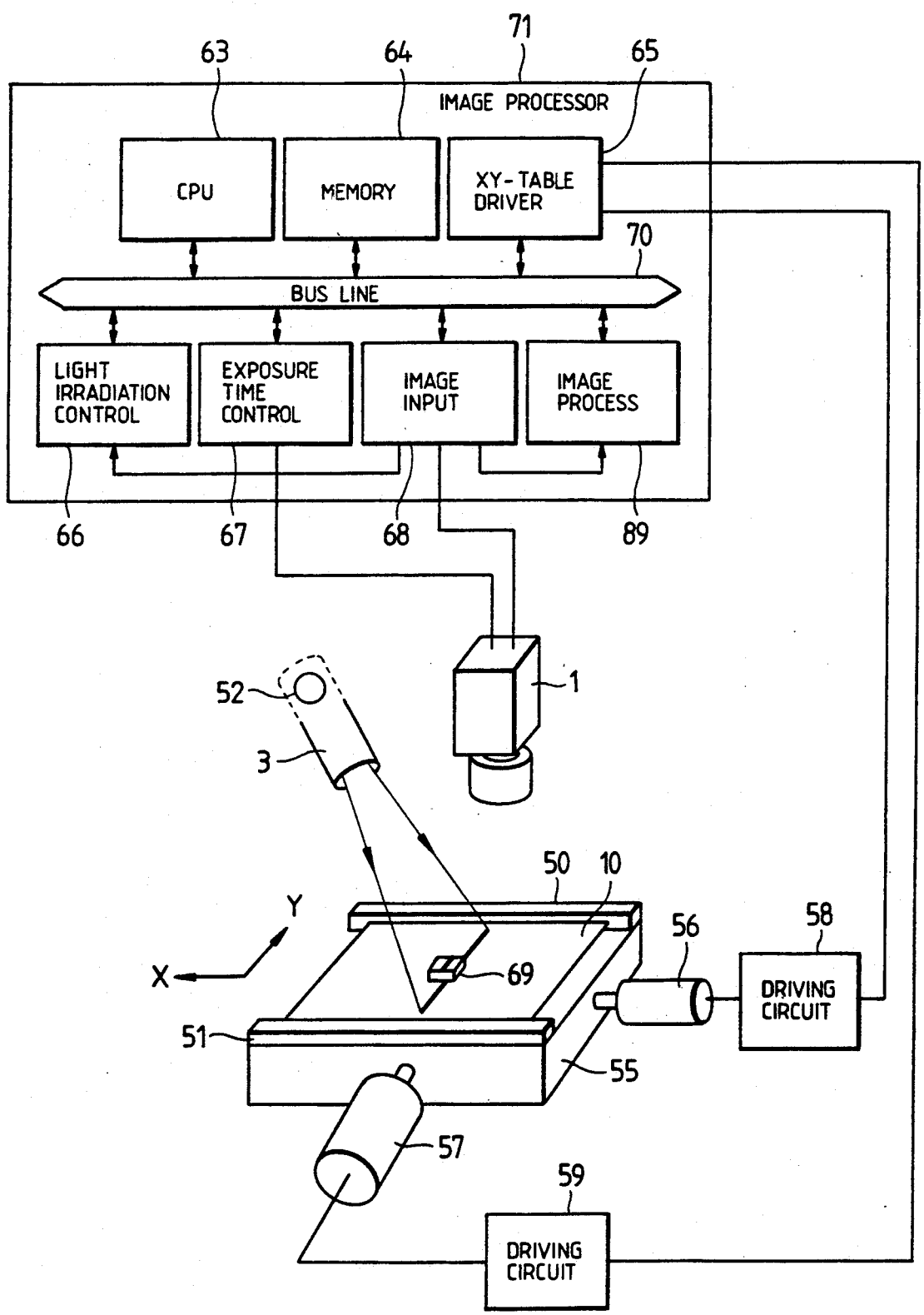
Figure 18:
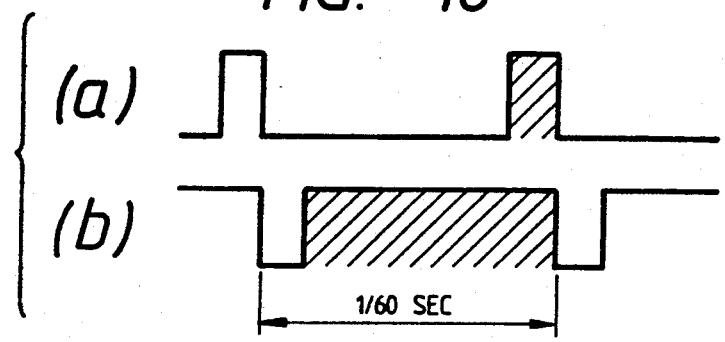
FIG. 18 is a diagram showing the imaging modes of an imager (TV camera)

FIG. 17 is a diagram showing another position detection apparatus according to the present invention. Referring to the figure, numeral 1 designates a CCD-shutter TV camera the exposure time of which can be electrically controlled from outside. The TV camera 1 can select a normal mode or common mode as shown at (b) in FIG. 18, in which an image is taken with a normal exposure time, and a high-speed shutter mode or shortened mode as shown at (a) in FIG. 18, in which an image is taken with an exposure time shorter than the normal exposure time. In FIG. 17, numeral 52 indicates a stroboscopic lamp, and numeral 3 a slit light projector by which light emitted from the stroboscopic lamp 52 is turned into slit light. Shown at numeral 71 is an image processor which controls driving circuits 58 and 59, the TV camera 1 and the stroboscopic lamp 52 and which processes the image taken by the TV camera 1 so as to detect the position etc of an electronic component 69. Numeral 63 indicates a CPU, numeral 64 a memory, numeral 65 an X-Y table driver which controls the driving circuits 58 and 59, numeral 66 a light irradiation controller which controls the emission timing of the stroboscopic lamp 52, and numeral 67 an exposure time controller which switches the TV camera 1 between the common mode and the shortened mode. The exposure time controller 67 switches the modes of the TV camera 1 as illustrated at camera modes (b) in FIG. 20, and it sets the common mode (CM) in the first field ($F_1$) and the shortened mode (SM) in the second field ($F_2$) and third field ($F_3$). Also in FIG. 17, numeral 68 indicates an image input circuit which receives an image signal delivered from the TV camera 1, numeral 89 an image processing circuit which receives the image applied to the image input circuit 68 and performs a slit line extracting process, a density image process, etc., and numeral 70 a system bus which couples the CPU 63, the memory 64, etc. The CPU 63, the memory 64, etc. constitute the image processor 71.

Figure 19:
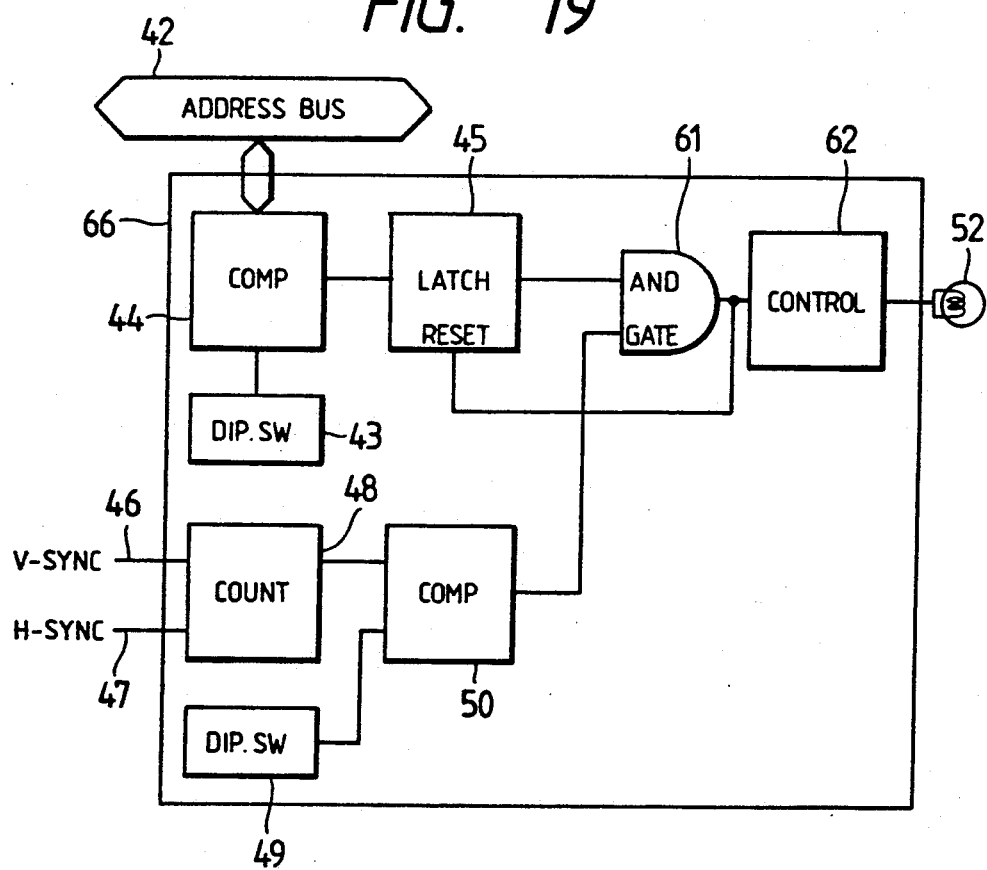
FIG. 19 is a circuit arrangement diagram of a light irradiation control circuit in the position detecting apparatus shown in FIG. 17.
Figure 20:
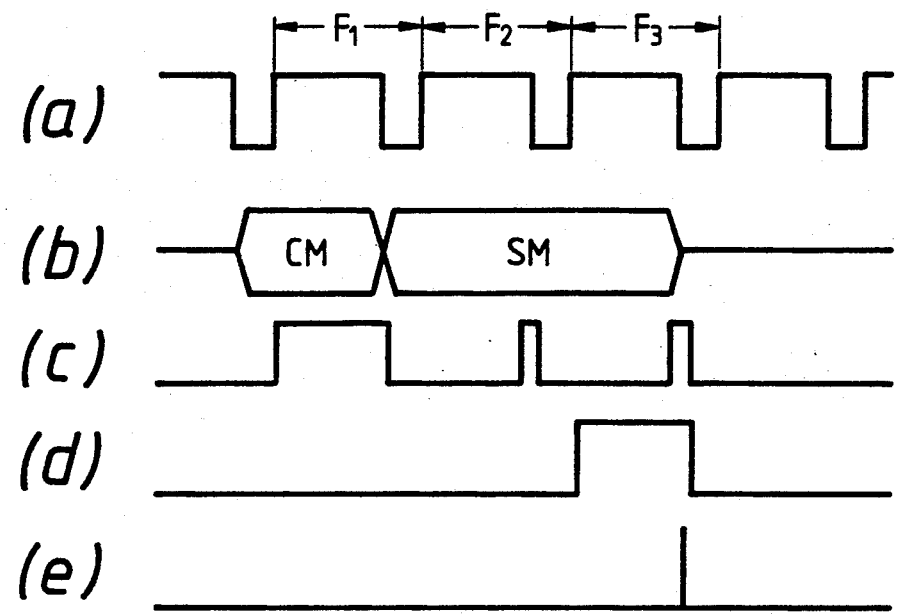
FIG. 20 is a time chart for explaining the operation of the position detecting apparatus shown in FIG. 17, FIGS. 21a-21c and FIG. 22 are diagrams for explaining the detection of the shape of a slit line.

FIG. 19 is a circuit arrangement diagram of the light irradiation controller 66 of the position detection apparatus shown in FIG. 17. Referring to FIG. 19, numeral 42 denotes the address bus of the system bus 70 (in FIG. 17), numeral 43 a DIP switch, and numeral 44 a comparator which delivers a signal to a latch circuit 45 only when an address set by the switch 43 has agreed with an address sent from the address bus 42. The latch circuit 45 stores the signal delivered from the comparator 44. In addition, as illustrated at (d) in FIG. 20, the address is set in the switch 43 so that a signal may begin to appear from the latch circuit 45 at the start of the third field $F_3$. That is, in only the third field $F_3$ (indicated at (a) in FIG. 20), the stroboscopic lamp 52 can emit the light or throw the slit light. Eventually, (d) in FIG. 20 shows the time of the output (slit light irradiation instruction) of the latch circuit 45. Numeral 48 in FIG. 19 indicates a counter which receives the vertical synchronizing signal 46 and horizontal synchronizing signal 47 of the image from the image input circuit 68 (shown in FIG. 17) and which counts up in response to the horizontal synchronizing signal 47 and is reset by the vertical synchronizing signal 46. The counter 48 provides an output indicative of the number of times of horizontal scanning within one image. Numeral 49 represents a switch, and numeral 50 a comparator which delivers a signal only when a value set by the switch 49 has agreed with the value delivered from the counter 48. The switch 49 has the value set therein so that the signal may be delivered from the comparator 50 within the exposure time of the TV camera 1 in the shortened mode (SM). An AND gate 61 delivers a signal when the signals are provided from the latch circuit 45 and the comparator 50. When supplied with the signal from the AND gate 61, the latch circuit 45 is reset. Shown at numeral 62 is a control circuit which causes the stroboscopic lamp 52 (in FIG. 17) to emit the light when supplied with the signal from the AND gate 61.

In the position detection apparatus, the modes of the TV camera 1 are switched as illustrated at (b) in FIG. 20, so that the exposure times of the TV camera 1 become as indicated at (c) in FIG. 20. Besides, the signal is delivered from the latch circuit 45 as shown at (d) in FIG. 20, and the signal is delivered from the comparator 50 within the exposure time of the TV camera 1 in the shortened mode (SM), so that the signal is provided from the AND gate 61 within the exposure time of the TV camera 1 in the third field $F_3$ as shown at (e) in FIG. 20. Therefore, the stroboscopic lamp 52 emits the light within the exposure time of the TV camera 1 in the third field $F_3$ so as to throw the slit light. Thus, in the first field $F_1$, the exposure time of the TV camera 1 is long, and the slit light is not thrown, so that the image taken by the TV camera 1 becomes as shown at (1a) in FIG. 1. In addition, in the second field $F_2$, the exposure time of the TV camera 1 is short, and the slit light is not thrown, so that the image taken by the TV camera 1 becomes as shown at (3a) in FIG. 1. Further, in the third field $F_3$, the exposure time of the TV camera 1 is short, and the slit light is thrown, so that the image taken by the TV camera 1 becomes as shown at (4a) in FIG. 1. Here, when the image of the first field $F_1$ taken by the TV camera 1 is input to the image processing circuit 89 (shown in FIG. 17) and is subjected to the density image process, a mark, a letter etc. on the electronic component 69 can be detected. Besides, when the slit line is extracted in the image processing circuit 89 by subtracting the image of the second field $F_2$ from the image of the third field $F_3$ by means of the CPU 63 and the memory 64, the mounted position of the electronic component 69 can be detected from the shape of the slit line.

Figure 21A:
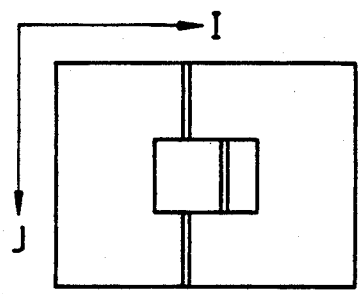
Figure 21B:
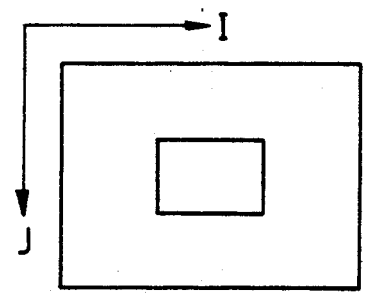
Figure 21C:
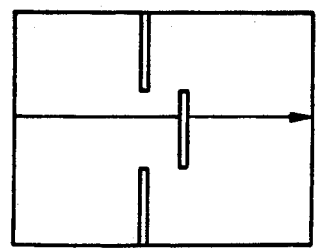
Figure 22:
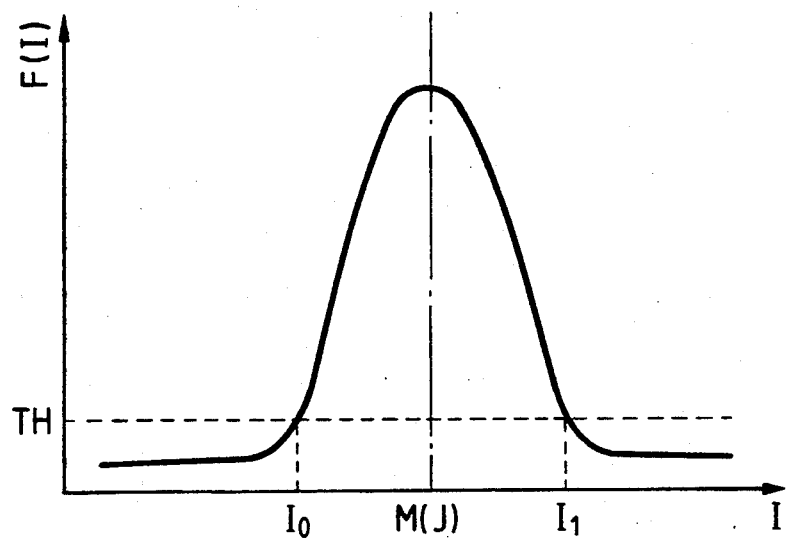

Next, there will be described the detection of the shape of the slit line. First, the image having no slit line as shown in FIG. 21b is subtracted from the image having the slit line as shown in FIG. 21a, thereby to obtain the difference image depicted in FIG. 21c. Subsequently, the brightness F(I) of the difference image on an I-directional line is detected. At the next step, I-coordinates $I_0$ and $I_1$ at which the brightness F(I) becomes a threshold value TH indicated in FIG. 22 are detected. At the succeeding step, the median M(J) of a brightness distribution as shown in FIG. 22 is evaluated by the following formula:

$$M(J) = \frac{\sum_{I=I_0}^{I_1} I \times F(I)}{\sum_{I=I_0}^{I_1} F(I)} \quad (4)$$

Letting N denote the number of pixels in the vertical direction, such operations are performed N times so as to find the medians M(J) for J=0, 1, ... and N. Then, the shape of the slit line can be detected.

Figure 23:
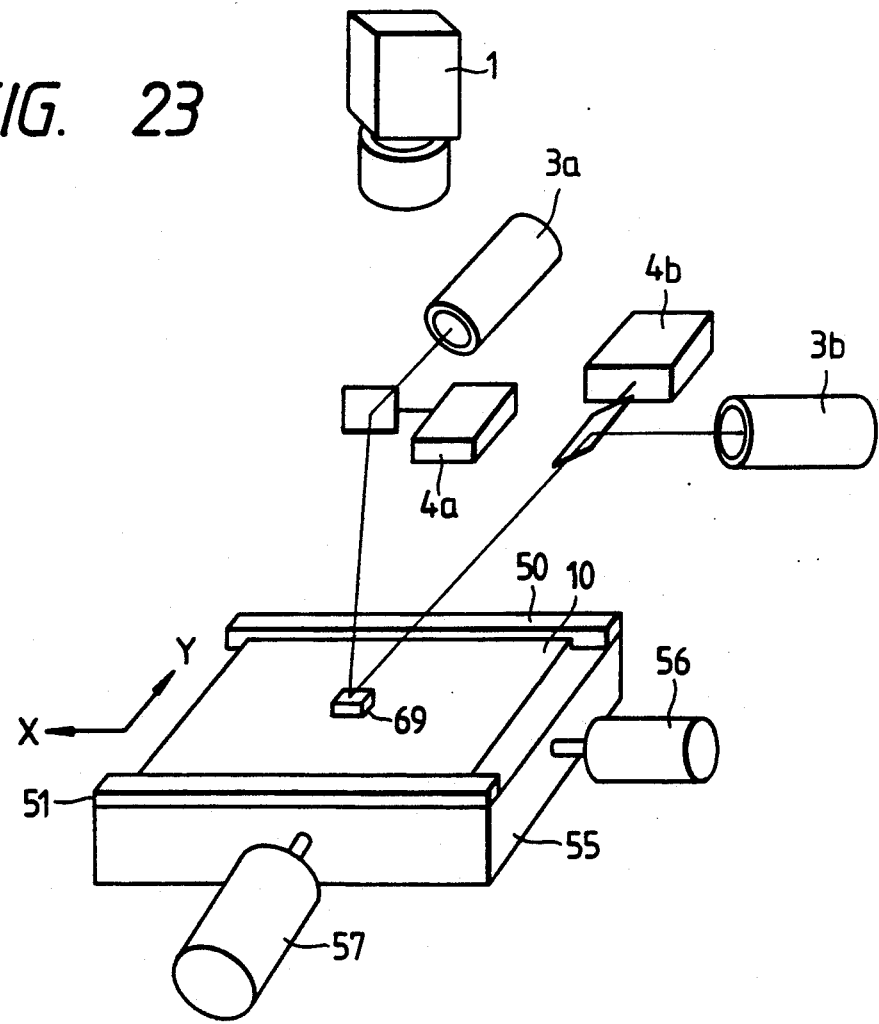
FIG. 23 is a view showing a part of another aspect of the position detecting apparatus according to the present invention.

FIG. 23 is a view showing a part of another position detection apparatus according to the present invention Referring to the figure, symbol 3a denotes a slit light projector which projects slit light in an X-direction, and symbol 4a a galvano-mirror which reflects the slit light projected from the slit light projector 3a. By changing the angle of the reflective portion of the galvano-mirror 4a, the position of the slit light thrown on a printed circuit board 10 by the slit light projector 4a can be moved in a Y-direction. Symbol 3b denotes a slit light projector which projects slit light in the Y-direction, and symbol 4b a galvano-mirror which reflects the slit light projected from the slit light projector 3b. By changing the angle of the reflective portion of the galvano-mirror 4b, the position of the slit light thrown on the printed circuit board 10 by the slit light projector 3b can be moved in the X-direction.

Figure 24:
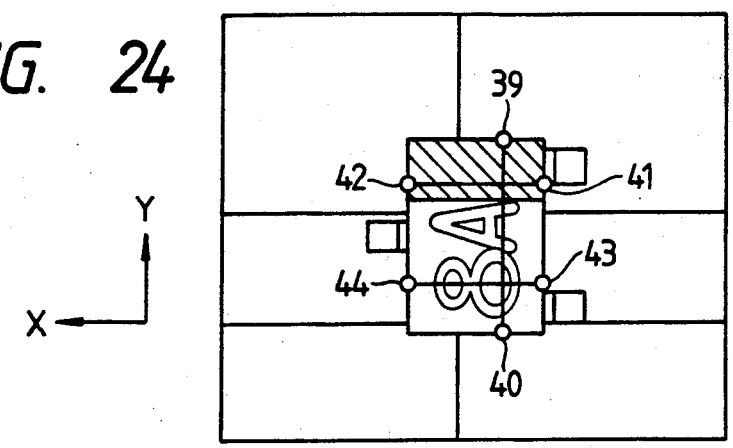
FIG. 24 is a diagram for explaining the image process of the position detecting apparatus shown in FIG. 23.

In the position detection apparatus, within the exposure time of a TV camera 1, the slit light is projected on the printed circuit board 10 by the slit light projector 3a with the angle of the reflective portion of the galvano-mirror 4a set at a predetermined angle, and thereafter, the angle of the reflective portion of the galvano-mirror 4a is changed, and the slit light is projected on the printed circuit board 10 by the slit light projector 3a, while the slit light is projected on the printed circuit board 10 through the galvano-mirror 4b by the slit light projector 3b. Then, an image having three slit lines as shown in FIG. 24 is obtained. Here, when the edge points 39-44 of the three slit lines are detected, the X-directional and Y-directional positions of an electronic component 69 in the image can be detected When a region where the electronic component 69 exists is subjected to a density image process on the basis of the detected results, a mark, a letter etc. on the electronic component 69 can be precisely detected Although the above embodiment has been explained as to the position detection apparatus which detects the installed position of an electronic component mounted on a printed circuit board, the present invention is applicable to position detection apparatuses which detect the position of a part on a surface where a shape change exists, the position of an article attached on a surface, and so forth.

As thus far described, in the detection apparatus according to the embodiment, the part of an image taken by a camera, except a slit line can be darkened, and the slit line of the image taken by the camera can be brightened, so that the slit line can be extracted with ease. In this manner, the effect of the present invention is remarkable.

Figure 25:
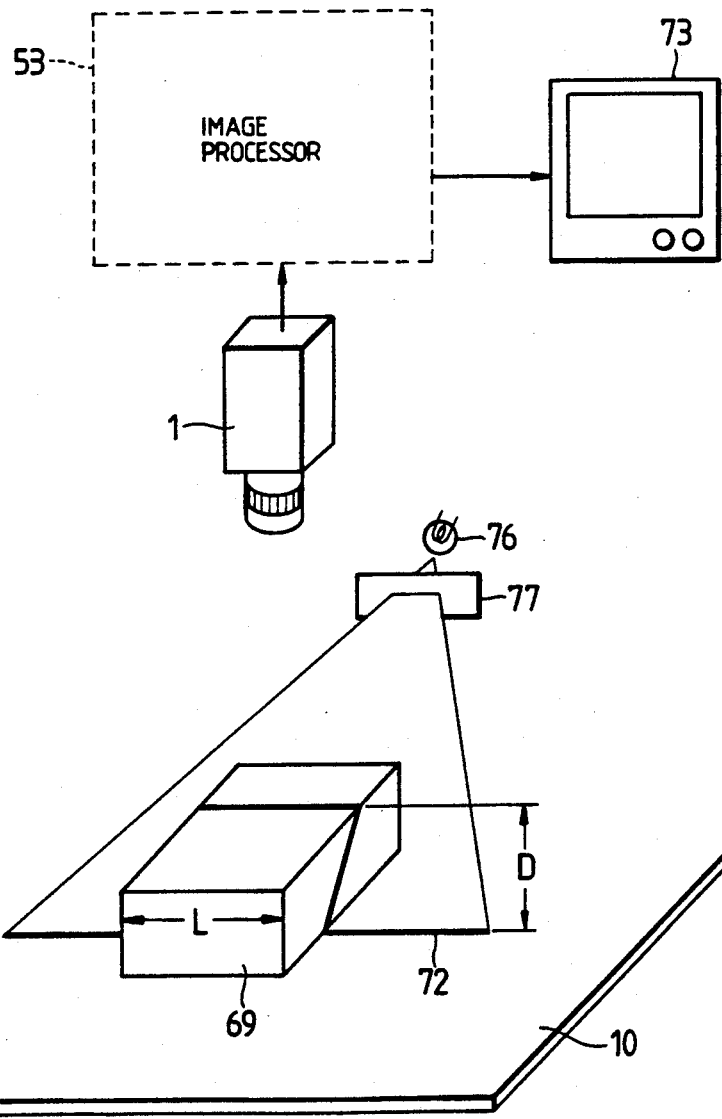
FIG. 25 is a schematic view showing an apparatus for performing a component position detecting method in still another embodiment of the present invention.

Next, as an embodiment of a method according to the present invention, there will be described an apparatus which can detect the position of a desired component even when a slit line is not broken at the edge points thereof FIG. 25 is a schematic view showing an apparatus for performing the method of detecting the position of an electronic component according to the present invention. Referring to the figure, numeral 10 designates a printed circuit board, on which an electronic component 69 is mounted. Numeral 76 indicates a light source, numeral 77 a slit by which light emitted from the light source 76 is turned into slit light, numeral 1 a television camera which images a slit line 72 developed by the projection of the slit light, numeral 53 an image processor which processes image data obtained with the television camera 1, and numeral 73 a monitor television set which is connected to the image processor 53.

Figure 26:
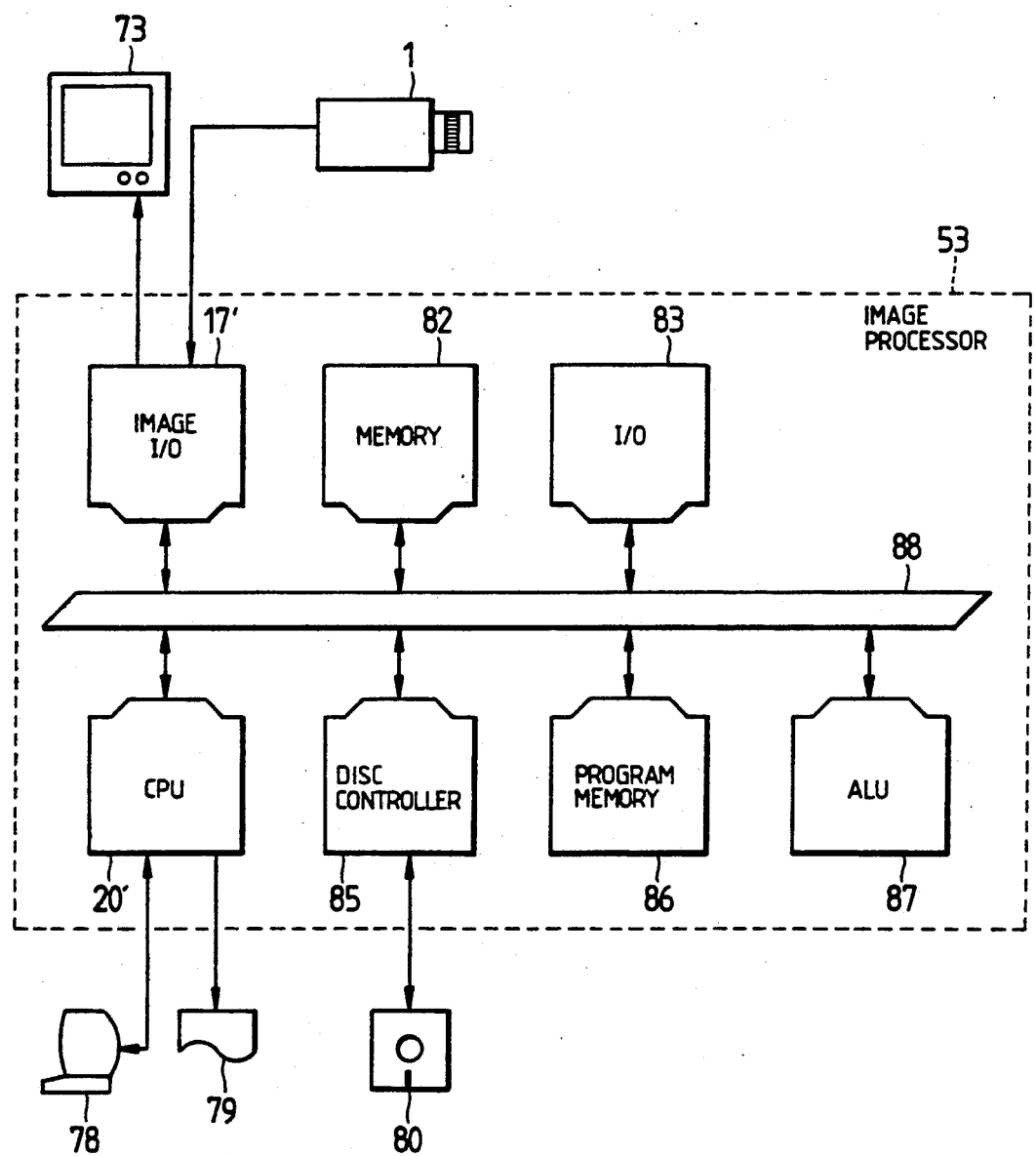
FIG. 26 is a diagram showing a part of the apparatus shown in FIG. 25.

FIG. 26 is a block diagram showing a part of the apparatus shown in FIG. 25. Referring to FIG. 26, numeral 17' indicates an image input/output circuit, numeral 82 an image memory, numeral 83 a general-purpose input/output circuit, numeral 20' a CPU, numeral 85 a floppy disc controller, numeral 86 a program memory, numeral 87 an arithmetic-logic unit, and numeral 88 a system bus. The image input/output circuit 17', image memory 82, CPU 20', etc. constitute an image processor 53. Numeral denotes a control panel which is connected to the CPU 20', numeral 79 a printer which is connected to the CPU 20', and numeral 80 a floppy disc which is controlled by the floppy disc controller 85.

Figure 28A:
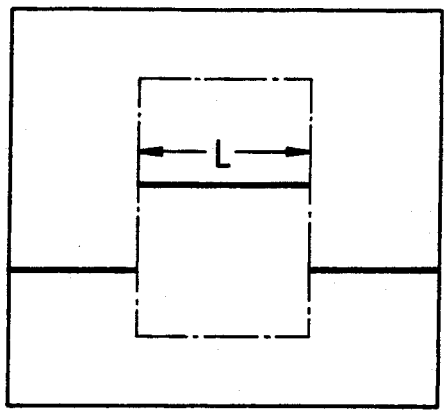

Next, the method of detecting the position of the electronic component by the use of the apparatus shown in FIGS. 25 and 26 will be described on the basis of a processing step flow chart in FIG. 27. First, image data as shown in FIG. 28b is extracted from the original image (FIG. 28a) of the slit line 72 taken by the television camera 1 as shown in FIG. 25, and it is stored in the position memory 82 shown in FIG. 26.

Figure 28B:
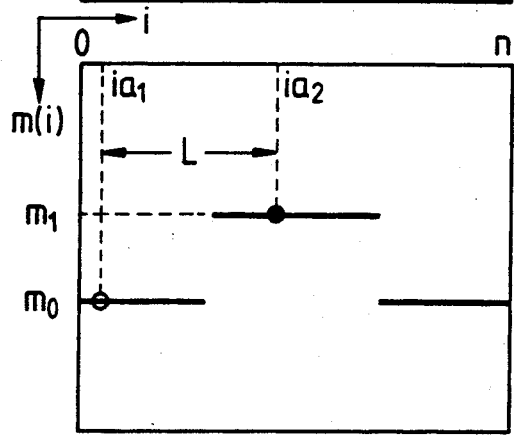

Subsequently, a position on the axis of abscissas i of the image is set at i=0 as illustrated in FIG. 28b (indicated by STEP-1 in FIG. 27).

Figure 28C:
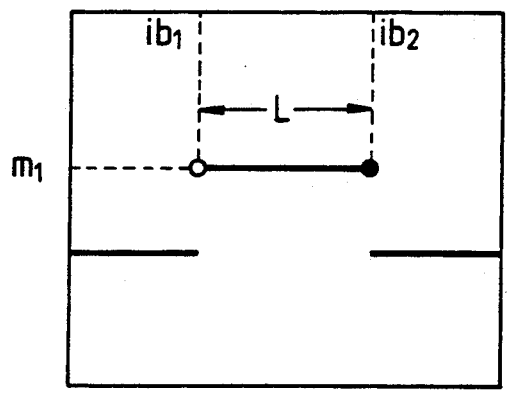
Figure 28D:
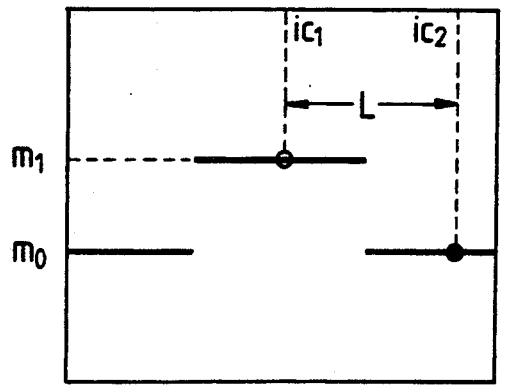

Subsequently, a value which corresponds to the maximum value of the gap (or difference in level) between the part of the slit line 72 on the surface of the printed circuit board 10 and the part thereof on the component 69 as illustrated in FIG. 25 is input beforehand as an initial value INM in this case. That is, as indicated by STEP-2 in FIG. 27, the image processor is initialized by setting the previous input value "GAP" as INM (GAP=INM). Subsequently, letting L denote the data of the length of the electronic component 69 as stored in the image memory 82 beforehand, the positions m(i) and m(i+L) of the slit line 72 at i and i+L along the axis of ordinates of the image are sensed, and the absolute value of the difference between m(i) and m(i+L) is substituted into DIS (DIS=|m(i)−m(i+L)| indicated at STEP-3). At the next step, the values GAP and DIS are compared (GAP>DIS indicated at STEP-4). Here, when the value DIS is smaller than the value GAP, the value DIS is substituted into the value GAP, and the value i on that occasion is substituted into POINT (STEP-5). Subsequently, values i and (n−L) are compared (STEP-6). Here, when the value i is smaller than (n−L), i=i+1 is set, and thereafter, the processing flow returns to STEP-3 (STEP-7). On the other hand, when the value i is greater than the value (n−L), the process is ended. Accordingly, when i=0 holds, DIS=$|m_0-m_1|$ is held. If $|m_0-m_1|$ is smaller than the value INM, there are held GAP=$|m_0-m_1|$, POINT=0 and i=1. Thus, as illustrated in FIG. 28b, even when i=ia$_1$ has held, DIS=$|m_0-m_1|$ holds, and GAP=$|m_0-m_1|$ and POINT=0 are held without any change. Besides, as illustrated in FIG. 28c, when i=ib$_1$ has held, DIS=$|m_1-m_1|$=0 holds, so that GAP=0 and POINT=ib$_1$ hold. Further, as illustrated in FIG. 28d, when i=ic$_1$ has held, DIS=$|m_1-m_0|$ holds, so that GAP=0 and POINT =ib$_1$ are held without any change. When i=n−L has been established, the process ends. The positions of the edge points in this case are ib$_1$ and i$_2$, and the position of the electronic component 69 can be detected from these values.

The above description taken in conjunction with FIGS. 28a-28d has referred to the case where the shape of the image is ideal. In actuality, however, the edges of the slit line sometimes fall into dull shapes. This case will be described with reference to FIGS. 29a-29e.

Figure 2:
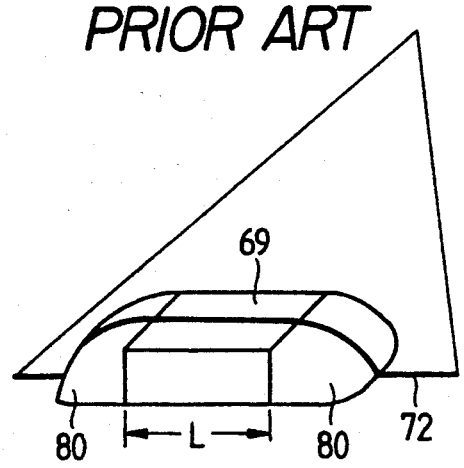
FIG. 2 is a perspective view showing a state in which slit light is projected on a component such as electronic component.
Figure 3A:
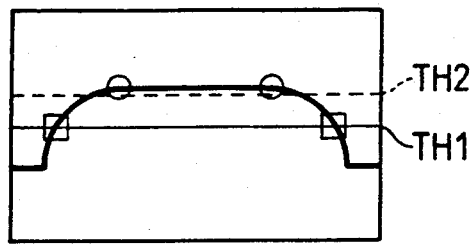
FIGS. 3a and 3b are diagrams for explaining a prior-art method of detecting the position of the component.
Figure 3B:
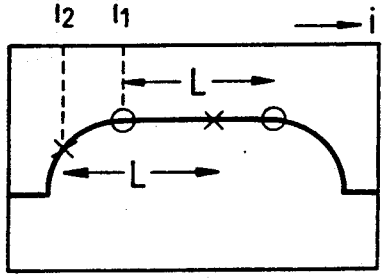
Figure 4:
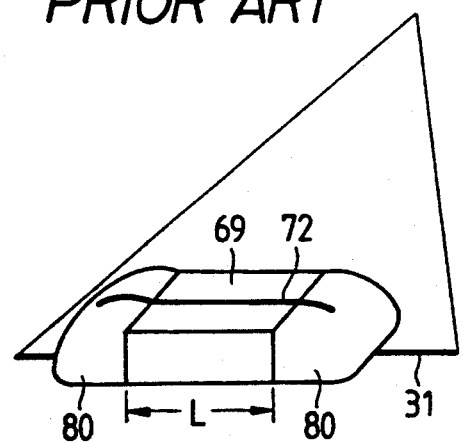
FIG. 4 is a perspective view showing a state in which slit light is projected on an electronic component.
Figure 5A:
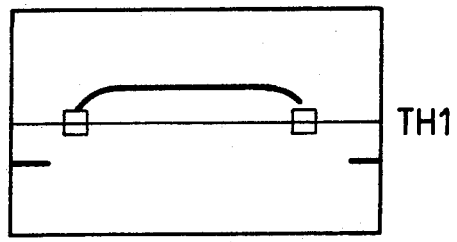
FIGS. 5a and 5b are diagrams for explaining the prior-art method of detecting the position of the electronic component.
Figure 5B:
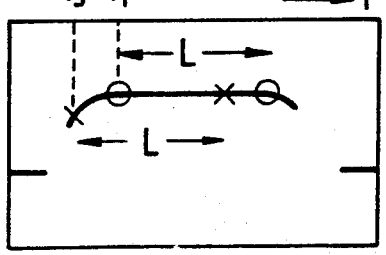
Figure 29A:
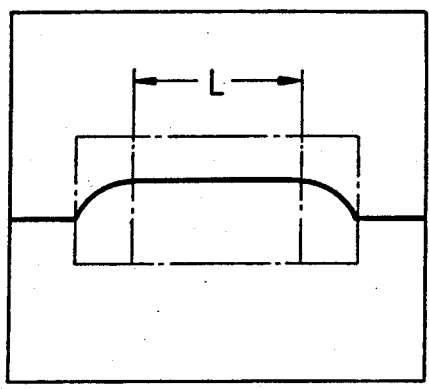
Figure 29B:
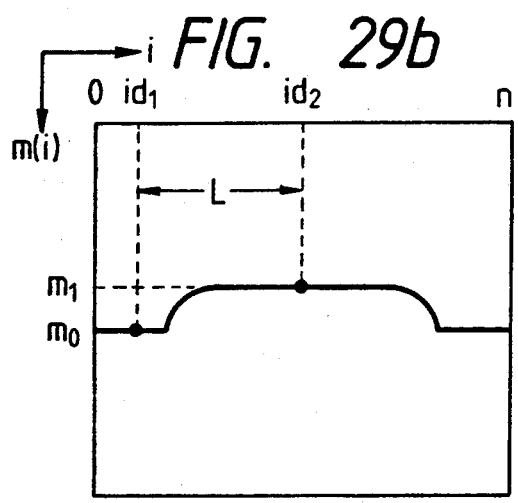
Figure 29C:
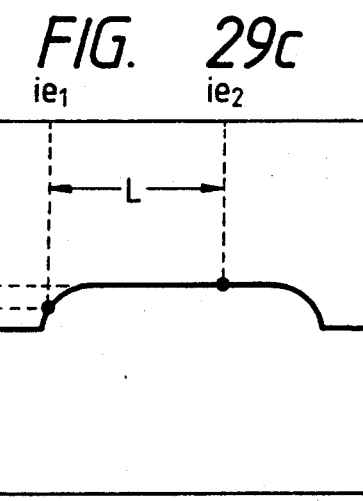
Figure 29D:
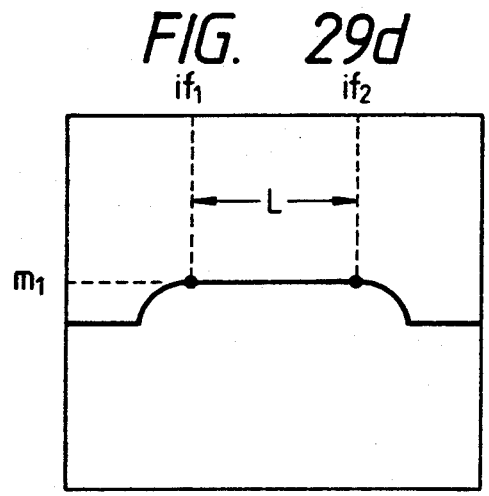
Figure 29E:
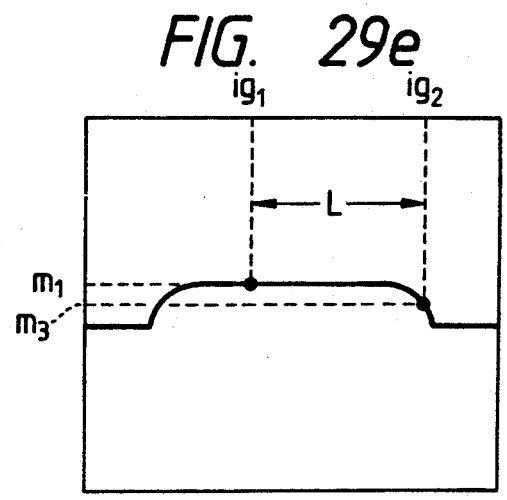

More specifically, there will be described the position detecting method for the electronic component in the case where image data as shown in FIG. 29b has been extracted from an original image as shown in FIG. 29a. First, for i=0, DIS=$|m_0-m_1|$ holds. If $|m_0-m_1|$ is smaller than INM, there are held GAP=$|m_0-m_1|$, POINT =0 and i=1. Thus, as illustrated in FIG. 29b, when i=id$_1$ has held, DIS=$|m_0-m_1|$ holds, and GAP=$|m_0-m_1|$ and POINT=0 are held without any change. Besides, as illustrated in FIG. 29c, when i=ie$_1$ has held, DIS=$|m_2-m_1|$ holds, so that GAP=$|m_2-m_1|$ and POINT=ie$_1$ are held. In this manner, in the case where i is the value which corresponds to the position of the solder part 80 on the left side of the sheet of the drawing (FIG. 2), increase in i decreases the value DIS, so that the value GAP decreases, and the value POINT increases. Besides, as illustrated in FIG. 29d, when i=if$_1$ has held, DIS=$|m_1-m_1|$=0 holds, so that GAP=0 and POINT=if$_1$ are held. Further, as illustrated in FIG. 29e, when i=ig$_1$ has held, DIS=$|m_1-m_3|$ holds, so that GAP=0 and POINT =if$_1$ are held without any change. That is, in the case where i is the value which corresponds to the position of the solder part 80 on the right side of the sheet of the drawing, increase in i increases the value DIS, so that the values GAP and POINT are held without any change. When i=n−L has held, the process ends. The positions of the edge points in this case are if$_1$ and if$_2$, and the position of the electronic component 69 can be detected from these values.

In the above embodiment, the distance DIS has been found so as to obtain the point POINT at which the distance DIS becomes the minimum. However, it is also allowed to detect the maximum gap point at which the gap is the maximum and to regard the maximum gap point as the edge point when the gap of a point obtained by adding ½ of the length data L of the electronic component 69 to the maximum gap point is equal to the gap of the maximum gap point. In addition, it is allowed to detect the length of the straight line part of the slit line and to regard the end part of the straight line part as the edge point when the length of the straight line part is equal to the length data L of the electronic component 69. That is, a conforming part to which the value of the dimensional data of the electronic component as stored in advance is applicable may be detected from the shape of the slit line so as to find the position of the electronic component on the basis of the position of the conforming part.

As thus far described, with the position detecting method for a component according to the above embodiment, even when a slit line is not broken at edge points, the edge points of the slit line can be detected, so that the position of the component can be precisely detected.

What is claimed is:

1. A component inspection apparatus for inspecting a component mounted on a circuit board for defects, comprising:
    a plurality of slit light projectors for projecting a plurality of slit lights;
    a plurality of mirrors for controllably reflecting the plurality of slit lights projected by the plurality of slit light projectors onto the component at controllable positions to produce a plurality of slit lines extending along respective axes on the component so that at least two of the slit lines intersect;
    camera means for imaging the component and the slit lines and for generating image data representing the imaged component and slit lines, wherein the camera means images at least one of the slit lines along a respective axis which is different from the respective axis along which the one slit line extends on the component; and
    an image processor for storing and processing the image data generated by the camera means to detect defects of the component;
    wherein the camera means comprises a plurality of cameras corresponding to the plurality of slit lines, and wherein each of the cameras images a respective one of the slit lines as a horizontal line.

2. A component inspection apparatus for inspecting a component mounted on a circuit board for defects, comprising:
    a plurality of slit light projectors for projecting a plurality of slit lights;
    a plurality of mirrors for controllably reflecting the plurality of slit lights projected by the plurality of slit light projectors onto the component at controllable positions to produce a plurality of slit lines extending along respective axes on the component so that at least two of the slit lines intersect;
    camera means for imaging the component and the slit lines and for generating image data representing the imaged component and slit lines, wherein the camera means images at least one of the slit lines along a respective axis which is different from the respective axis along which the one slit line extends on the component; and
    an image processor for storing and processing the image data generated by the camera means to detect defects of the component;
    wherein the plurality of slit lines comprises two slit lines which orthogonally intersect; and
    wherein the camera means comprises two cameras, and wherein each of the two cameras images a respective one of the two slit lines as a horizontal line.

3. A component inspection apparatus according to claim 1 or 2, wherein the slit light projectors and the mirrors are controllable to selectively produce or not produce slit lines on the component, and wherein the image processor comprises:

a first memory for storing image data generated by the camera means when slit lines are produced on the component;

a second memory for storing image data generated by the camera means when slit lines are not produced on the component; and processing means for accessing the first and second memories to read out the image data stored in the first and second memories in a direction perpendicular to scanning lines of the camera means, for obtaining a difference between the image data read out from the first and second memories, and for detecting the defects of the component on the basis of the obtained difference.

4. A component inspection apparatus for inspecting a component mounted on a circuit board for defects, comprising:

a slit light projector for projecting a slit light onto the component to produce a slit line on the component;

a camera for imaging the component and the slit line and for generating image data representing the imaged component and slit line;

control means for controlling the slit light projector to project the slit light onto the component for a period which is no longer than an exposure period of the camera; and an image processor for storing and processing the image data generated by the camera to detect defects of the component.

5. A component inspection apparatus according to claim 4, wherein the slit light projector comprises a stroboscopic lamp, and wherein the control means controls a light emission period of the stroboscopic lamp.

* * * * *